United States Patent
Chan et al.

(10) Patent No.: US 8,161,429 B1
(45) Date of Patent: Apr. 17, 2012

(54) METHODS AND APPARATUS FOR INITIALIZING SERIAL LINKS

(75) Inventors: Allen Chan, Fremont, CA (US); Faisal Dada, Ottawa (CA); Karl Lu, Nepean (CA); Bryon Moyer, Cupertino, CA (US); Samson Tan, San Francisco, CA (US); Venkat Yadavalli, Santa Clara, CA (US); Arye Ziklik, Sunnyvale, CA (US)

(73) Assignee: Altera Corporation, San Jose, CA (US)

(*) Notice: Subject to any disclaimer, the term of this patent is extended or adjusted under 35 U.S.C. 154(b) by 2348 days.

(21) Appl. No.: 10/923,477

(22) Filed: Aug. 20, 2004

(51) Int. Cl.
*G06F 17/50* (2006.01)
(52) U.S. Cl. .............. 716/100; 716/101; 716/102
(58) Field of Classification Search .............. 716/100, 716/101, 102
See application file for complete search history.

(56) References Cited

U.S. PATENT DOCUMENTS

| | | | | |
|---|---|---|---|---|
| 5,467,369 A | * | 11/1995 | Vijeh et al. | 375/224 |
| 6,211,456 B1 | * | 4/2001 | Seningen et al. | 174/27 |
| 6,924,986 B1 | * | 8/2005 | Sardella et al. | 361/785 |
| 2005/0278682 A1 | * | 12/2005 | Dowling | 716/18 |
| 2007/0081414 A1 | * | 4/2007 | Douady et al. | 365/233 |

* cited by examiner

*Primary Examiner* — Thuan Do
*Assistant Examiner* — Magid Dimyan
(74) *Attorney, Agent, or Firm* — Treyz Law Group; G. Victor Treyz; Nancy Y. Ru

(57) ABSTRACT

A serial communications protocol is provided that has optional link initialization features such as an optional automatic lane polarity reversal feature and an optional automatic lane order reversal feature. A user that desires to create a protocol-compliant integrated circuit design can either choose to include or to not include the optional features. Integrated circuits in which the optional serial communications link features are implemented are able to perform the lane polarity reversal and lane order reversal functions. Integrated circuits in which the optional serial communications link features have not been implemented are not able to perform these functions, but can be fabricated using fewer circuit resources.

21 Claims, 14 Drawing Sheets

METHODS AND APPARATUS FOR INITIALIZING SERIAL LINKS

BACKGROUND OF THE INVENTION

This invention relates to serial communications interfaces, and more particularly, to ways in which to initialize serial communications links between integrated circuits such as programmable logic devices.

Serial communications formats are often used in modern electronics systems. Serial communications can be faster than parallel communications, use fewer pins, and, particularly when differential signaling schemes are used, can have higher noise immunity.

It can be challenging to handle serial data streams at high data rates (e.g., at data rates above several Gbps). As a result, it is often advantageous to support high-speed serial data communications using multiple smaller serial data paths operating in parallel. These smaller serial data paths are often referred to as "lanes."

Before two integrated circuits can communicate over a single-lane or multi-lane serial link, the link must be initialized. The initialization process involves handshaking operations between the circuits to ensure that the link is set up properly. The type of handshaking operation that is used during link initialization depends on the type of serial communications protocol being used for the link. With some communications protocols, it is possible to check the link for problems such as inadvertently reversed conductors (polarity reversal) and improperly ordered lanes (lane reversal) during link initialization. When available, these checking procedures can help reduce errors and ensure proper operation of a link.

Because it takes a certain amount of circuit resources to implement lane initialization features such as automatic polarity reversal and lane order reversal, a logic designer may not always desire to include these features in a design. However, these features may be mandated by the serial communications protocol being used. If the designer is not willing to commit on-chip resources for implementing these features, the designer must either risk creating a non-compliant design that violates the protocol being used or must use a serial communications protocol that never allows for the use of automatic polarity or lane order reversal.

SUMMARY OF THE INVENTION

In accordance with the present invention, a serial communications protocol is provided that allows a logic designer to decide whether or not to include features such as automatic polarity reversal and automatic lane order reversal in a given design. When these features are implemented on a given integrated circuit, the circuit will automatically check for problems such as incorrect lane polarity or incorrect lane ordering. If a problem is detected, the circuit can make adjustments in real time to correct the problem.

If desired, resources can be conserved by choosing not to implement these features. A circuit or group of circuits without these features will still be compliant with the serial communications protocol and can still complete the handshaking operations required for successful communications, so long as the lane polarity and lane order are correct.

Logic design tools are provided for designing integrated circuits compliant with the protocol. Integrated circuits constructed in accordance with the present invention may be programmable logic device integrated circuits or other suitable integrated circuits such as digital signal processing circuits, microprocessor circuits, application specific integrated circuits, etc.

Further features of the invention, its nature and various advantages will be more apparent from the accompanying drawings and the following detailed description of the preferred embodiments.

DETAILED DESCRIPTION OF THE PREFERRED EMBODIMENTS

The present invention relates to serial communications protocols that allow serial link initialization features such as automatic lane polarity reversal and automatic lane order reversal to be either implemented or not implemented in a given integrated circuit depending on the needs of a user (i.e., a logic designer). The invention also relates to computer-aided design tools that help logic designers design integrated circuits using such serial communications protocols. Another aspect of the invention relates to circuits that are compliant with these protocols and methods for using these circuits.

Serial communications may involve a single path (i.e., a single differential pair of signal wires over which data is conveyed in series) or may involve multiple parallel serial paths (called lanes). In a multi-lane arrangement, a relatively higher-rate serial link is formed from multiple parallel relatively lower-rate serial paths. For example, four lanes operating at about 3.125 Gbps may be used in parallel to support the functions of a 10 Gbps Gigabit Ethernet serial link. This is merely one illustrative configuration. The data streams from any number of lower-rate serial channels may be combined to form a higher-rate serial link.

Some aspects of the present invention (e.g., lane polarity reversal) relate to the polarity of a pair of differential signal wires in a given lane and apply to both single-lane and multi-lane configurations. Other aspects of the present invention (e.g., automatic lane order reversal) apply to multi-lane configurations. These aspects of the invention are often described together, but may be used either together or separately if desired.

Figure 1:
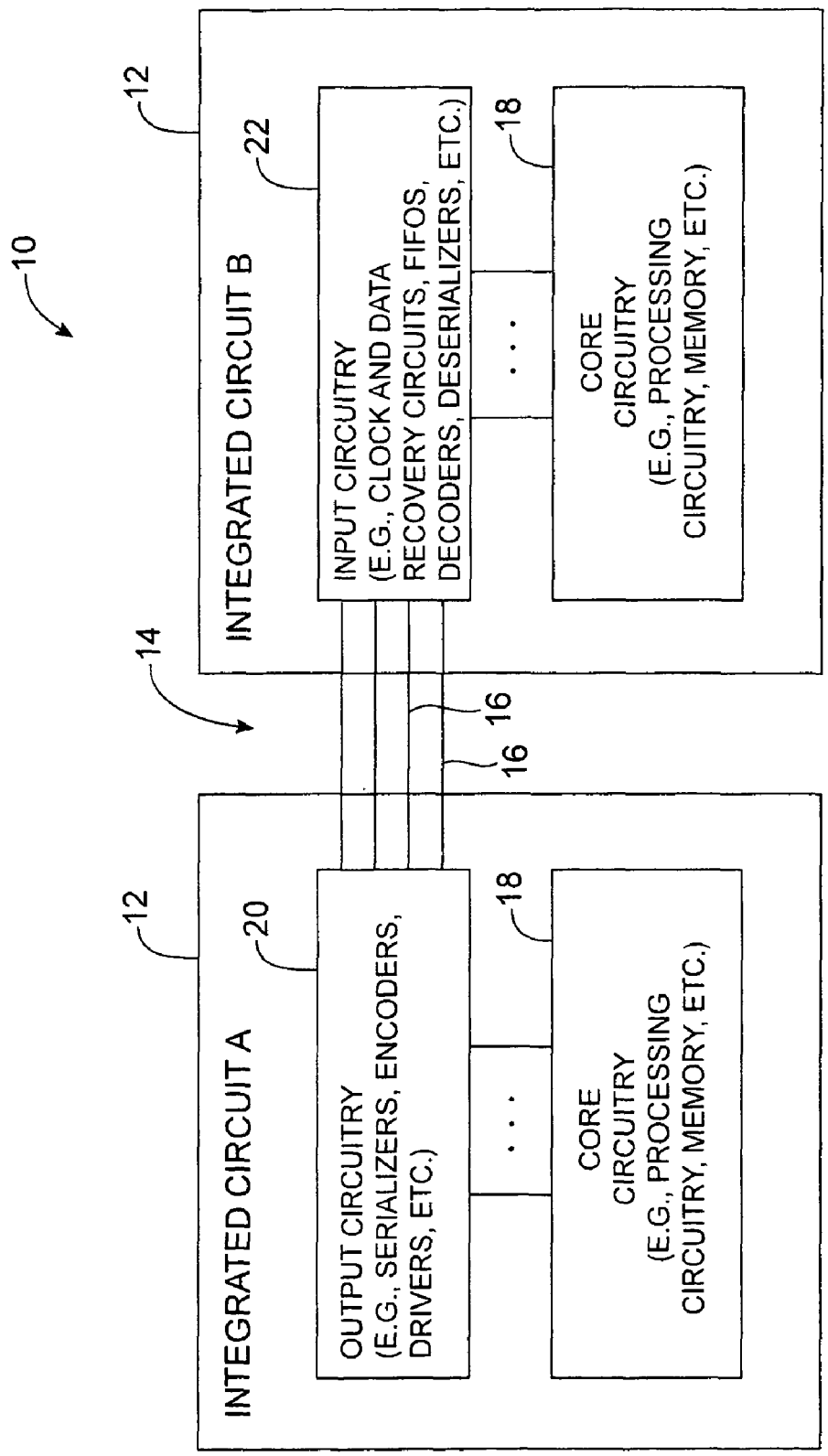
FIG. 1 is a schematic diagram showing how two integrated circuits can communicate over a serial communications link made up of four parallel lanes using a serial communications protocol in accordance with the present invention.

Illustrative equipment 10 having two integrated circuits 12 that communicate over a serial communications link 14 is shown in FIG. 1. The integrated circuits 12 may be used in any suitable electronics equipment. For example, each integrated circuit 12 may be mounted on a different line card connected to a common system backplane in rack-mounted data processing or telecommunications equipment. As another example, integrated circuits 12 may be mounted on the same card or may be used in other types of electronic equipment. Each integrated circuit 12 may be, for example, a programmable logic device, a microprocessor, a digital signal processor, an application-specific integrated circuit (ASIC), etc.

Serial link 14 is generally a high-speed link having a data rate of many Gbps, although slower serial links may be used if desired. Link 14 is made up of a number of slower parallel serial links (lanes) 16. Each lane 16 may, for example, be formed from a differential signal path having a pair of conductors that support communications at a serial data rate of a few Gbps. One of the conductors in the pair is generally considered to be the "positive" line and one is considered the "negative" line. If the pair of conductors in a lane is inadvertently flipped, a positive output terminal at integrated circuit A may be electrically connected to a negative input terminal at integrated circuit B and the negative output terminal at circuit A may be connected to the positive input terminal at circuit B. This condition, which is known as lane polarity reversal, causes positive output signals from circuit A to be received as negative signals at circuit B.

Care may be taken to avoid lane polarity reversal conditions when possible. Nevertheless, inadvertent reversal conditions sometimes occur. When one of the circuits (e.g., integrated circuit B) has automatic lane polarity reversal capabilities, that circuit will automatically check for a lane polarity reversal condition and, if reversal is detected, the circuit will automatically reconfigure itself so that the signals are returned to their proper polarity before they are distributed further within the circuit.

The use of multi-lane serial links such as the illustrative four-lane link 14 of FIG. 1 to support communications between chips in an electrical system helps to overcome some of the difficulties associated with handling single-link serial data streams at extremely high data rates (e.g., 10 Gbps), because the lanes 16 have lower data rates than would be required if all of their serial data were passed through a single pair of differential signal conductors.

Because each lane 16 may be connected and routed differently through equipment 10, the data streams on lanes 16 tend to become skewed with respect to each other (i.e., the data bits in one stream will be received at a time that is shifted ahead or behind the data bits of another stream). The different environments of each lane 16 will also generally cause the data streams on each lane to fall out of synchronization with each other. The clock associated with each lane 16 tends to be influenced by environmental factors during transmission. As a result, even if a common clock is used to transmit the signals over lanes 16, the clocks for lanes 16 will no longer be identical when they are received (i.e., the lanes 16 will no longer be synchronized). Deskewing and synchronization circuitry may be used to ensure that the data from the lanes is properly reconstructed at the receiving integrated circuit.

Another issue to be addressed concerns lane order. When multiple lanes are used in a link 14, the data from within a sending integrated circuit (e.g., circuit A) is distributed among the lanes 16 in a particular order. To properly reconstruct the data at the receiving integrated circuit (e.g., integrated circuit B), the data must be received from each lane in the same order. If lanes are reversed (i.e., if lane 1 at circuit A is connected to lane 4 at circuit B), the link 14 will not function properly. Circuits with automatic lane order reversal capabilities can check to determine whether the order of the lanes within a given link 14 is correct during lane initialization procedures and, if a reversed condition is detected, appropriate corrective actions can be taken (e.g., by automatically reversing the lanes to their proper configuration at the receiving integrated circuit).

In general, integrated circuits such as circuits 12 of FIG. 1 may have only transmitting circuitry, may have only receiving circuitry, or may have both transmitting and receiving circuitry. In the example of FIG. 1, integrated circuit A has core circuitry 18 that generates data. Output circuitry 20 may be used to serialize the data from core circuitry 18 and to encode the data to embed a clock in each data stream. Drivers in output circuitry 20 may be used to transmit the data from circuitry 18 to integrated circuit B over the multiple parallel lanes 16 of serial link 14.

At the receiving end of link 14, input circuitry 22 can be used to receive the transmitted data. The input circuitry 22 may include clock and data recovery circuits for extracting embedded clock signals, first-in-first-out (FIFO) buffer circuitry for deskewing and synchronizing the incoming data on the parallel lanes 16. Input circuitry 22 may also include decoding circuitry for decoding data that was encoded in output circuitry 20 and deserializers for converting the serial data from lanes 16 to parallel data. The resulting data is provided to core circuitry 18 on integrated circuit B. Core circuitry 18 may be any type of circuitry, including programmable logic, microprocessor circuitry, digital signal processor circuitry, processing circuitry that is part of an application-specific integrated circuit, memory circuitry, etc.

A serial communications protocol in accordance with the present invention preferably has certain link initialization features such as automatic lane polarity reversal and automatic lane order reversal that are optional. Because these features are optional, a logic designer can choose not to include support for either or both of these features while still satisfying the protocol. A logic designer who is designing an integrated circuit and who decides to include an optional feature will benefit from the enhanced functionality the feature provides. If the logic designer decides not to include support for the optional feature in a given design, resources on the circuit that would otherwise need to be used for implementing the feature will be available to support other functions. For example, a microprocessor that does not include an optional serial communications feature can generally be constructed using less circuit real estate. As another example, forgoing an optional feature on a programmable logic device will free up programmable logic resources for use in supporting other functions on the device.

Although the present invention may be used in the context of any suitable integrated circuits that use serial communications (i.e., microprocessors, digital signal processors, application specific integrated circuits, etc.), the invention will sometimes be described in the context of programmable logic devices for clarity.

Figure 2:
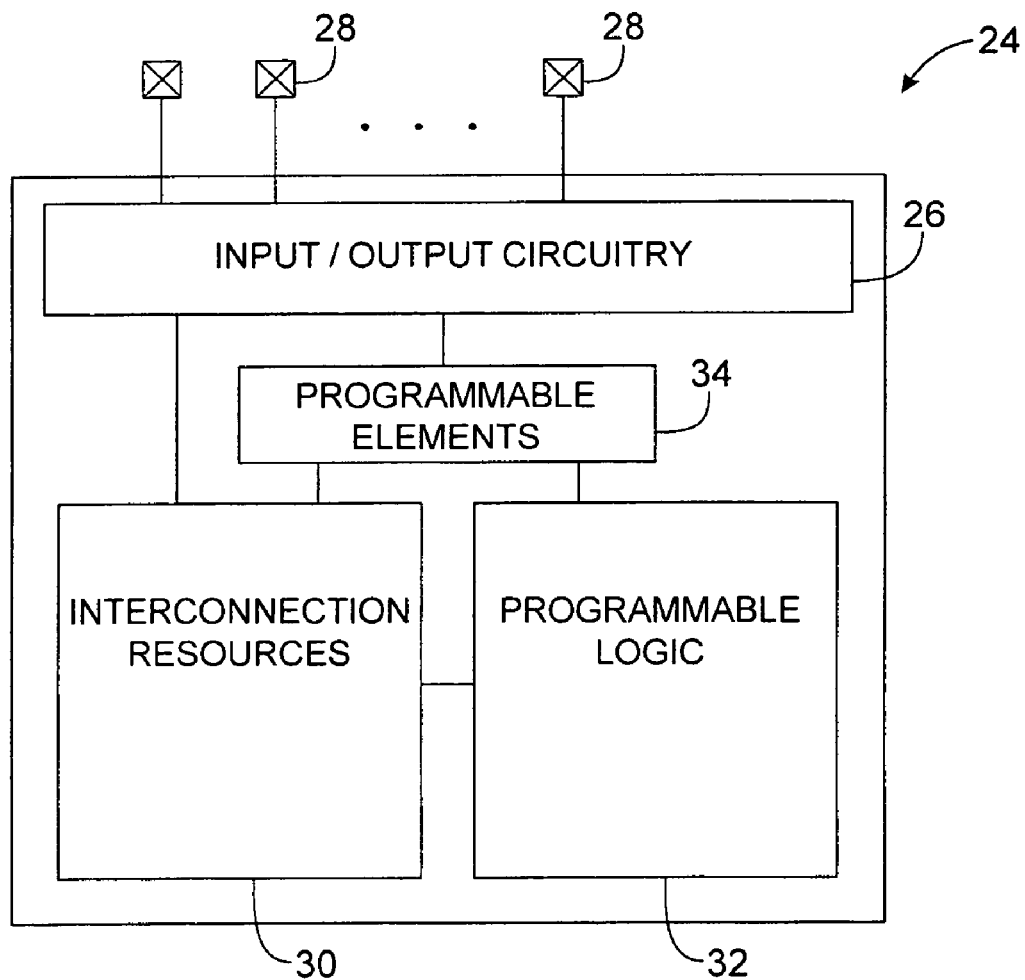
FIG. 2 is a diagram of an illustrative programmable logic device integrated circuit that may communicate using a serial communications protocol in accordance with the present invention.

An illustrative programmable logic device 24 in accordance with the present invention is shown in FIG. 2.

Programmable logic device 24 may have input/output circuitry 26 for driving signals off of device 24 and for receiving signals from other devices via input/output pins 28. Input/output circuitry 26 may include serial communications circuitry such as the output circuitry 20 and input circuitry 22 of FIG. 1. Certain pairs of pins 28 may be associated with respective pairs of differential signal conductors. Each pair of differential signals conductors may be associated with a respective lane 16 (FIG. 1) for supporting high-speed serial communications.

Interconnection resources 30 such as global and local vertical and horizontal conductive lines and busses may be used to route signals on device 24. Programmable logic 32 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers. Some of the logic of programmable logic device 24 is fixed. Programmable logic 32 includes components that may be configured so that device 24 performs a desired custom logic function.

Programmable logic device 24 may be based on any suitable programmable technology. With one suitable approach, configuration data (also called programming data) may be loaded into programmable elements 34 using pins 28 and input/output circuitry 26. The programmable elements (also sometimes called configuration bits or programmable function control elements) may each provide a static control output signal that controls the state of an associated logic component in programmable logic 32.

In a typical arrangement, the programmable elements 34 may be random-access memory (RAM) cells that are loaded from an external erasable-programmable read-only memory chip via certain pins 28 and appropriate portions of input/output circuitry 26. The loaded RAM cells 34 provide static control signals that are applied to the terminals (e.g., the gates) of circuit elements (e.g., metal-oxide-semiconductor transistors) in programmable logic 32 to control those elements (e.g., to turn certain transistors on or off) and thereby configure the logic in programmable logic 32. Circuit elements in input/output circuitry 26 and interconnection resources 30 are also generally configured by the RAM cell outputs as part of the programming process. The circuit elements that are configured in input/output circuitry 26, interconnection resources 30, and programmable logic 32 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 24. Other suitable programmable logic device technologies that may be used for device 24 include one-time programmable device arrangements such as those based on programmable logic elements made from fuses or antifuses, programmable logic devices in which elements 34 are formed from electrically-programmable read-only-memory (EPROM) or erasable-electrically-programmable read-only-memory (EEPROM) technology, or programmable logic devices with programmable elements made from magnetic storage elements, etc.

Regardless of the particular type of programmable element arrangement that is used for device 24, programmable elements are preferably provided with configuration data by a user (e.g., a logic designer). Once provided with configuration data, the programmable elements 34 selectively control (e.g., turn on and off) portions of the circuitry in the programmable logic device 24 and thereby customize its functions so that it will operate as desired.

The circuitry of device 24 may be organized using any suitable architecture. As an example, the logic of programmable logic device 24 may be organized in a series of rows and columns of larger programmable logic regions or areas each of which contains multiple smaller logic regions or areas (e.g., areas of logic based on look-up tables or macrocells). These logic resources may be interconnected by interconnection resources such as associated vertical and horizontal interconnection conductors. Interconnection conductors may include global conductive lines that span substantially all of device 24, fractional lines such as half-lines or quarter lines that span part of device 24, staggered lines of a particular length (e.g., sufficient to interconnect several logic areas), smaller local lines that interconnect small logic regions in a given portion of device 24, or any other suitable interconnection resource arrangement. If desired, the logic of device 24 may be arranged in more levels or layers in which multiple large areas are interconnected to form still larger portions of logic. Still other device arrangements may use logic that is not arranged in rows and columns. Portions of device 24 (e.g., in input/output circuitry 26 and elsewhere) may be hardwired. As an example, hardwired transmitter and receiver circuitry may be used to assist in serial communications functions. Hardwired digital signal processing circuitry (e.g., multipliers, adders, etc.) may also be used.

Figure 3:
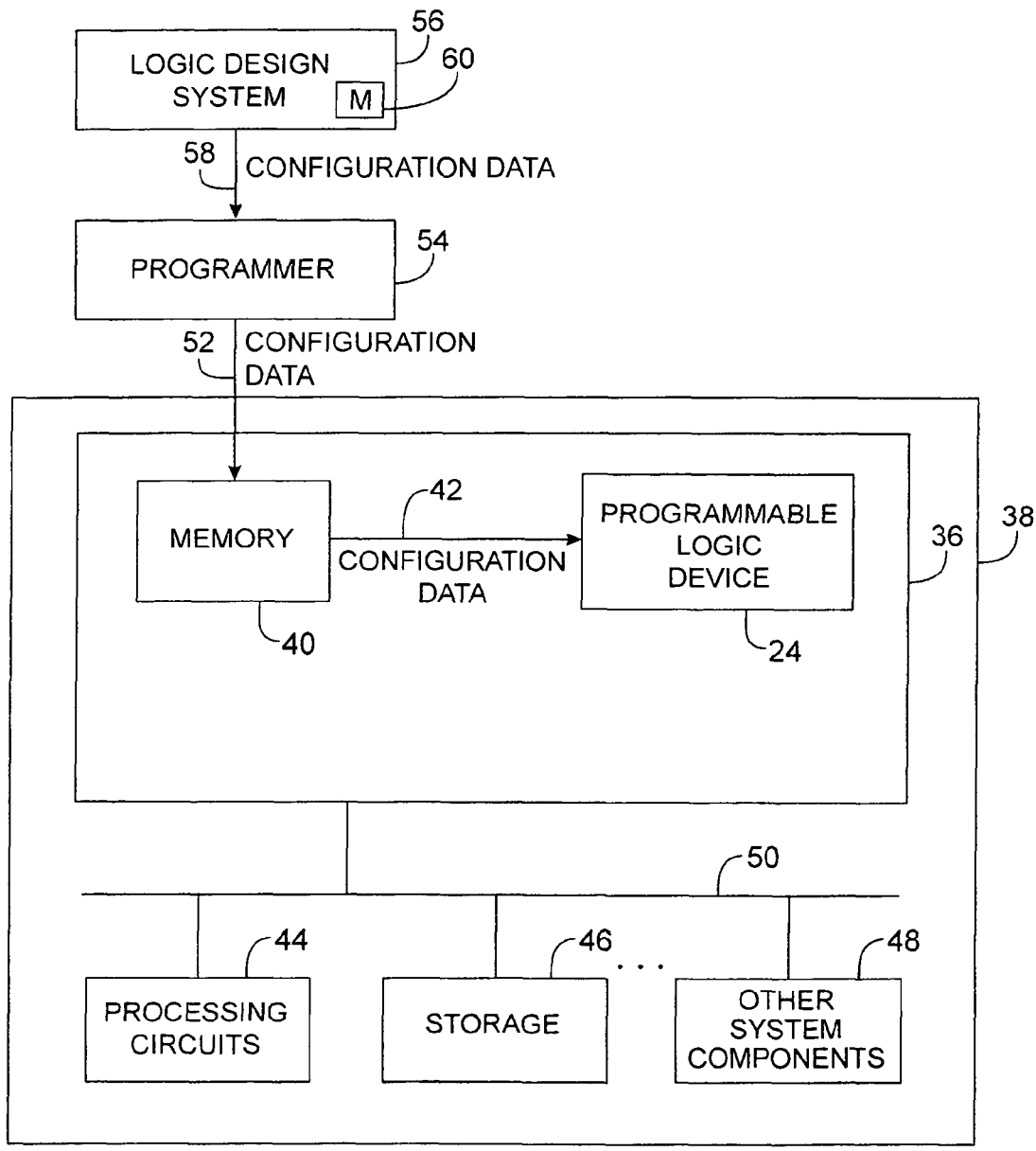
FIG. 3 is a diagram showing how configuration data may be generated for a programmable logic device integrated circuit in accordance with the present invention.

An illustrative system environment for a programmable logic device 24 is shown in FIG. 3. Programmable logic device 24 may be mounted on a board 36 in a system 38. In general, programmable logic device 24 may receive programming data from programming equipment or from any other suitable equipment or device. In the example of FIG. 3, programmable logic device 24 is the type of programmable logic device that receives configuration data from an associated memory chip 40. With this type of arrangement, memory chip 40 may, if desired, be mounted on the same board 36 as programmable logic device 24. The memory 40 may be an erasable-programmable read-only memory (EPROM) chip or other non-volatile memory device. When system 38 boots up (or at another suitable time), the configuration data for configuring the programmable logic device may be supplied to programmable logic device 24 from memory 40 via path 42. The configuration data that is supplied to the programmable logic device may be stored in the programmable logic device in configuration data cells (memory).

System 38 may include processing circuits 44, storage 46, and other system components 48 which may, if desired, contain circuitry that is compliant with the serial communications protocol of the invention. The components of system 38 may be located on one or more boards such as board 36 or other suitable mounting structures or housings and may be interconnected by busses and other electrical paths 50, which may include single-lane and multi-lane serial communications links.

Memory 40 may be supplied with the configuration data for device 24 over a path such as path 52. Memory 40 may, for example, receive the configuration data from a programmer 54 (e.g., an EPROM programmer) or other suitable equipment that stores this data in memory 40.

It can be a significant undertaking to design and implement a desired logic circuit in a programmable logic device and to perform other system design activities. Logic designers therefore generally want to use logic design systems based on computer-aided-design (CAD) tools to assist them in designing circuits and systems. A logic design system can help a logic designer design and test a complex circuit. When a design is complete, the logic design system may be used to generate configuration data for programming the appropriate programmable logic device or mask sets for creating a custom chip.

As shown in FIG. 3, the configuration data produced by a logic design system 56 may be provided to programmer 54 over a path such as path 58. The programmer 54 can program the configuration data into memory 40, so that memory 40 can later provide this configuration data to the programmable logic device 24 over path 42.

In arrangements of the type shown in FIG. 3, the programmable logic device 24 may have configuration data cells formed from memory cells such as static random-access memory cells. This is merely one illustrative arrangement for programming a programmable logic device 24. Any suitable arrangement for programming programmable logic device 24 may be used if desired. For example, programmable logic device 24 may be based on non-volatile configuration data cells such as erasable-programmable read-only memory (EPROM) cells. With this type of arrangement, device 24 can be configured by programming the configuration data into the EPROM cells on the device. Programmable logic device 24 may also be based on programmable elements such as fuses and antifuses or programmable elements based on other technologies (e.g., magnetic devices, etc.).

Regardless of the particular approach used for programming programmable logic device 24, programmable logic device 24 can be configured using configuration data produced by a logic design system 56.

Logic design system 56 includes storage 60. Software is used to implement the functions of system 56. The software may be stored on a computer-readable medium (storage) 60. Storage 60 may include computer memory chips, removable and fixed media such as hard disk drives, flash memory, compact discs (CDs), DVDs, and floppy diskettes, tapes, or any other suitable memory or storage device(s). When the software of system 56 is installed, storage 60 has instructions and data that cause the computing equipment in logic design system 56 to execute various methods (processes). When performing these processes, the computing equipment is configured to implement the functions of the logic design system 56.

Figure 4:
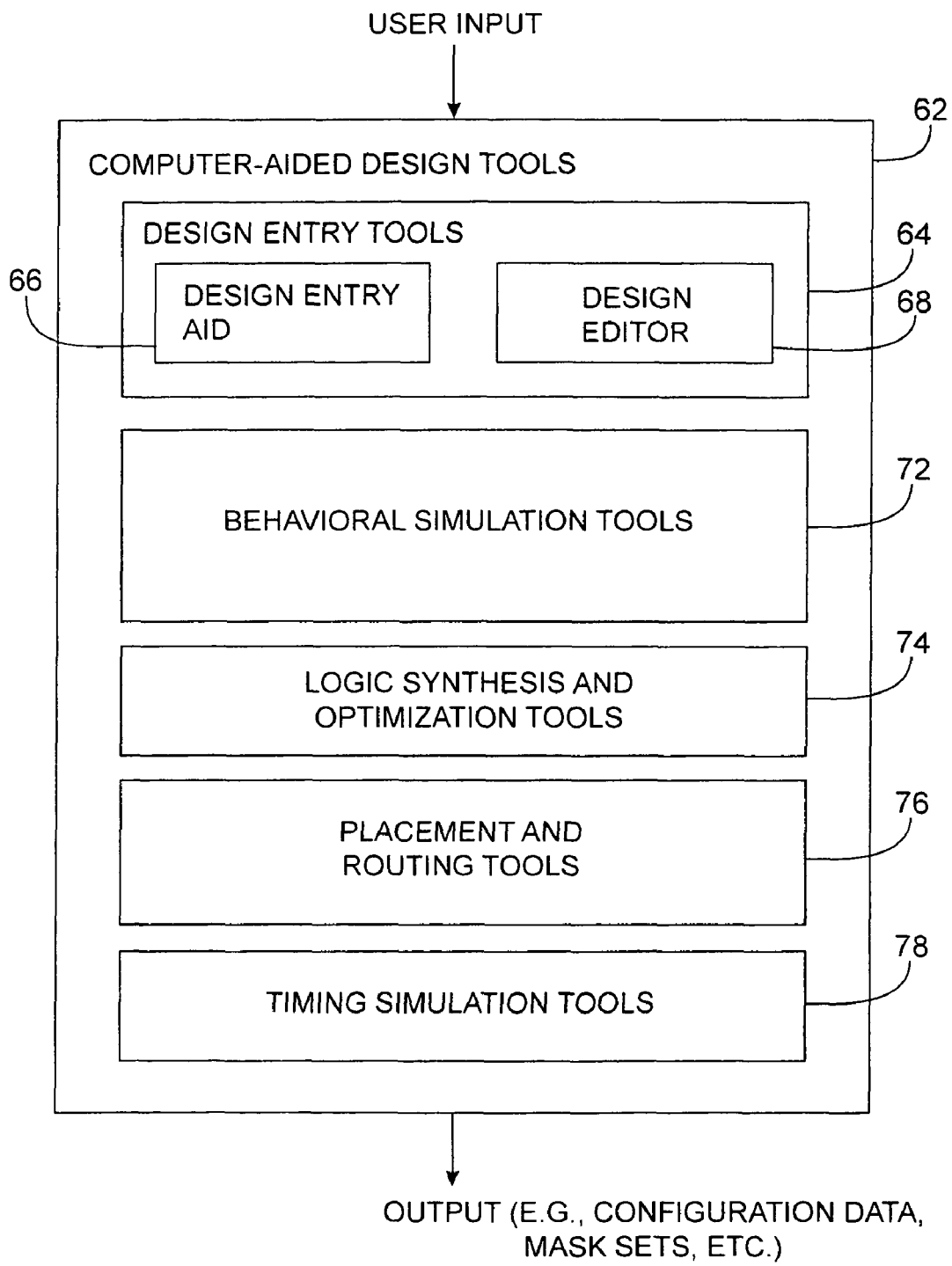
FIG. 4 is a diagram showing how computer-aided design tools may be used to create a logic design based on user input in accordance with the present invention.

Logic design system 56 may use computer-aided design tools such as tools 62 of FIG. 4. Tools such as tools 62 may be used to produce the configuration data for the programmable logic device 24 from a set of design specifications or other suitable input. Tools such as tools 62 can also be used to generate output in other suitable formats (e.g., as specifications for lithographic mask sets for semiconductor fabrication of a desired integrated circuit, etc.).

The design process typically starts with the formulation of logic circuit functional specifications. A logic designer can specify how a desired circuit should function using design entry tools 64. Design entry tools 64 may include tools such as design entry aid 66 and design editor 68. An illustrative design entry aid is the Altera MegaWizard design entry aid. Such design entry aids 66 help a logic designer locate a desired design from a library of existing logic designs and may provide computer-aided assistance to the logic designer for entering (specifying) the desired design. Design editor 68 may be used to enter a design (e.g., by entering lines of hardware description language code) or to edit a design obtained from a library.

Design entry tools 64 may be used to allow a logic designer to provide a desired logic design to logic system 62 using any suitable format. For example, design entry tools 64 may include tools that allow the logic designer to enter a logic design using truth tables. Truth tables can be specified using text files or timing diagrams and may be imported from a library. Truth table logic design entry may be used for a portion of a large circuit or for an entire circuit.

As another example, design entry tools 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design entry tools 64 may allow the logic designer to provide a logic design to the logic design system 56 using a hardware description language such as Verilog hardware description language (HDL) or Very High Speed Integrated Circuit Hardware Description Language (VHDL). The logic designer can enter the logic design by writing hardware description language code with editor 68. Blocks of code may be imported from libraries if desired.

After the design has been entered using design entry tools 64, behavioral simulation tools 72 may be used to simulate the functional performance of the design. If the functional performance of the design is incomplete or incorrect, the logic designer can make changes to the design using design entry tools 64. The functional operation of the new design can be verified using behavioral simulation tools 72 before synthesis operations have been performed using tools 74. Simulation tools such as tools 72 may also be used at other stages in the design flow if desired (e.g., after logic synthesis). The output of the behavioral simulation tools 72 may be provided to the logic designer in any suitable format (e.g., truth tables, timing diagrams, etc.)

Once the functional operation of the logic design has been determined to be satisfactory, logic synthesis and optimization tools 74 may be used to implement the logic design in a particular programmable logic device (i.e., in the logic and interconnect resources of a particular programmable logic device product or product family). As an example, if the logic design has serial communications circuitry that supports automatic lane polarity reversal, the logic synthesis and optimization tools 74 may decide to use an available hardwired automatic polarity detection and reversal circuit on the programmable logic device to perform the desired polarity reversal function. Tools 74 may, alternatively, implement the polarity reversal functions using a "soft" design—i.e., using mostly or entirely programmable logic resources. As another example, if the logic design includes automatic lane order detection capabilities and the programmable logic device being used does not have suitable lane order detection and reversal hardware resources, the logic synthesis and optimization tools 74 may select appropriate logic gates to use to detect and reverse lane order.

Tools 74 can optimize the design by proper selection of the available hardware to implement different logic functions in the logic design. Often tradeoffs are made because multiple logic functions are competing for limited resources.

After logic synthesis and optimization using tools 74, the logic design system may use tools such as placement and routing tools 76 to perform physical design steps (layout synthesis operations). Placement and routing tools 76 are used to determine how to place the circuits for each logic function within the programmable logic device. For example, if two counters interact with each other, the placement and routing tools 76 may locate these counters in adjacent logic regions on the programmable logic device to minimize interconnect delays. The placement and routing tools 76 create orderly and efficient implementations of logic designs for a given programmable logic device.

After an implementation of the desired logic design in the programmable logic device has been generated using placement and routing tools 76, the implementation of the design may be tested using simulation tools such as timing simulation tools 78. Timing simulation tools may, for example, predict the delay times that are associated with certain signal paths through the device. The timing simulation tools may be used to verify that the particular implementation of the design that is being tested does not contain signal paths with delays that are outside of the limits imposed during the design phase. For example, the timing simulation tools may be used to ensure that the slowest data paths are fast enough that the minimum desired clock speed and minimum signal path delay constraints are satisfied. The timing simulation tools may also examine the design for potential race conditions or other conditions that affect device performance.

After satisfactory testing using tools 78, the CAD tools 62 can produce the configuration data for the programmable logic device or can generate other suitable output data (e.g., the specifications for a lithographic mask set for fabricating an integrated circuit incorporating the logic design). Depending on the type of programmable logic device being used (e.g., a device based on non-volatile memory, a device based on volatile memory, a device based on fuses or antifuses, etc.), configuration data may be programmed into the programmable logic device directly or may be provided to a memory device that later (e.g., upon power-up) loads the configuration data into the programmable logic device to program the device.

Figure 5:
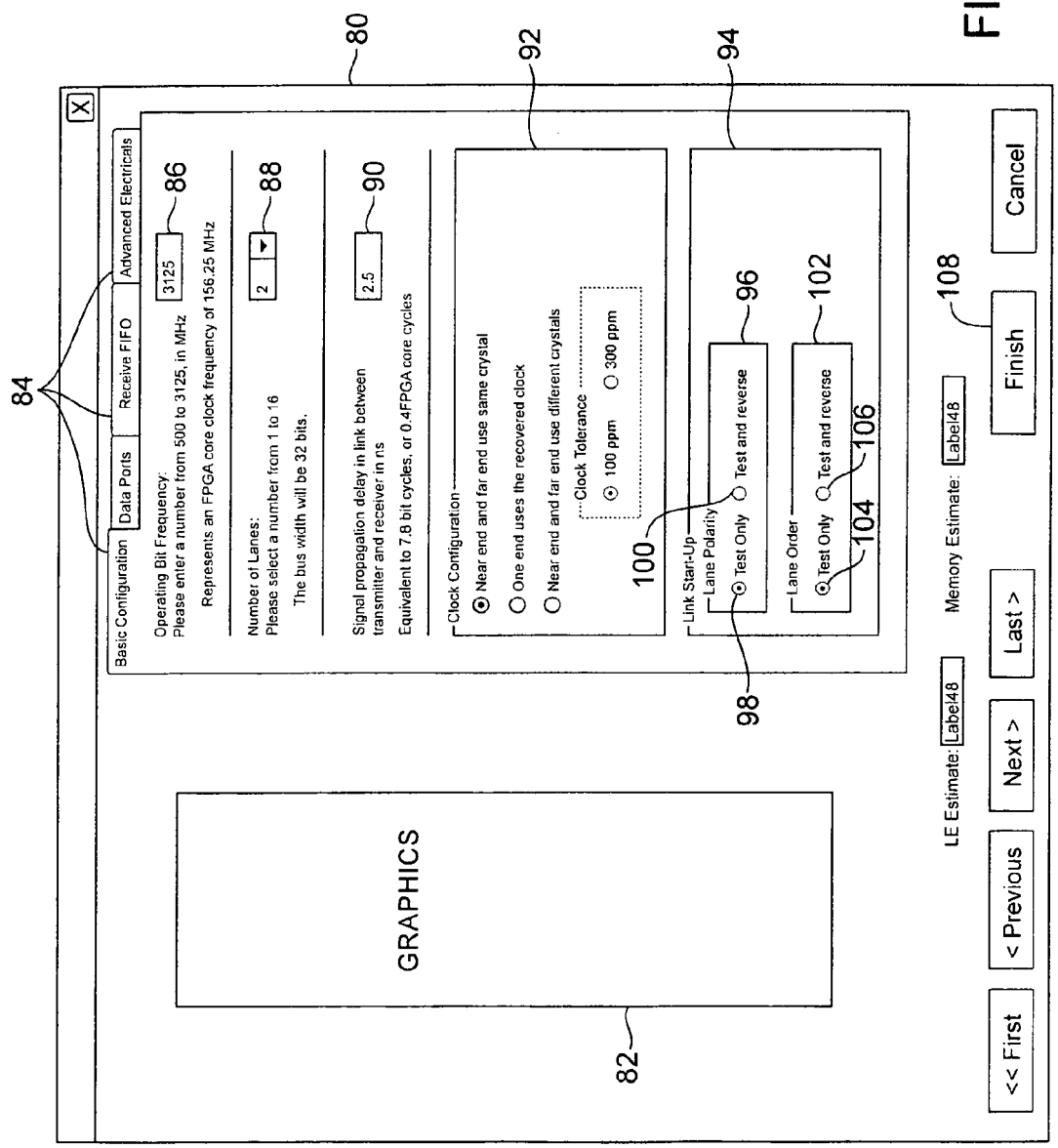
FIG. 5 shows an illustrative screen that may be presented to a logic designer by a computer-aided design tool when designing an integrated circuit using a serial communications protocol in accordance with the present invention.

To assist a logic designer in choosing whether or not to include optional serial communications link initialization functions such as automatic polarity reversal and lane order reversal, computer-aided design tools 62 (e.g., design entry tools 64) can provide the logic designer with on-screen options with which the logic designer can make choices. An illustrative screen 80 that may be displayed for the user of a computer-aided design system 56 with tools 62 is shown in FIG. 5. A screen such as screen 80 may be displayed, for example, by a design entry aid 66 or design editor 68.

Screen 80 may include a region 82 of graphics that visually depicts the design that the logic designer is working on. Region 82 may include text in the form of labels and annotations.

Tabs 84 may be used to select various panels of options. In the example of FIG. 5, the user (logic designer) has chosen to work on the "basic configuration" panel of options. On this panel, option 86 may be used to specify a desired operating frequency for the device being designed. Option 88 may be used to specify the number of lanes 16 to be used. Option 90 may be used to specify a signal propagation delay for the link between the transmitter and receiver. Option 92 may be used to specify clock configuration parameters.

Lane initialization features can be selected using option 94. With the serial communications protocol of the present invention, automatic lane polarity reversal and automatic lane order reversal are optional lane initialization features. Lane polarity option 96 may be used to select what type of behavior is desired with respect to lane polarity reversal. Lane order option 102 may be used to direct the tools 62 how the circuit being designed should handle lane order problems. Any suitable user interface may be used to allow a user to customize lane initialization features. The arrangement of FIG. 5 is merely illustrative.

Using the illustrative options 94 of FIG. 5, if the user desires the circuit design to test for correct lane polarity, but does not wish for the circuit to automatically reverse an incorrect lane polarity, the user may select option 98. If the user desires to create a circuit that automatically checks for incorrect lane polarity and that automatically reverses a detected incorrect lane polarity, the user may select option 100. The user may click on test only option 104 if the user desires to create a circuit where link 14 will be tested to determine if the order of lanes 16 is proper, but will not reverse the order if the lanes are backwards. The user may click on test and reverse option 106 if both automatic lane order testing and automatic lane order reversal are desired.

By using on-screen options of the type shown in FIG. 5 or by otherwise providing the user with an opportunity to choose which optional lane initialization features to include in a given integrated circuit design, the computer-aided design tools 62 (e.g., the design entry tools such as design entry aid 66 and/or design editor 68) allow the user to increase functionality (at the expense of increased resource consumption) or allow the user to reduce resource consumption (at the expense of reduced functionality) while still producing a protocol-compliant design.

When the user has finished selecting the desired options for the design, the user may click on finish option 108. The computer-aided design tools 62 (FIG. 4) may then be used to complete the design process.

If, for example, the logic designer is designing circuitry to be implemented in a programmable logic device, the computer-aided design tools 62 may be used to complete the design process by producing configuration data for programming a programmable logic device. If options such as options 100 and 106 of FIG. 5 were selected, the configuration data that is created will reflect the inclusion of the desired optional features. If options such as options 98 and 104 of FIG. 5 were selected, a different set of configuration data will be created. When loaded into a programmable logic device, the configuration data will either configure the programmable logic on the device to implement the desired optional link initialization features or will configure the programmable logic on the device so that resources are conserved by not implementing the features.

If the logic designer is designing circuitry for an integrated circuit such as a microprocessor, digital signal processor, or other such circuit (including programmable logic devices) whose serial communications circuitry is exclusively or at least partially hardwired, the output of the computer-aided design tools 62 may be used to complete the design process by producing specifications for a lithographic mask set for fabricating the integrated circuit. If options such as options 100 and 106 of FIG. 5 were selected, the circuitry produced using the mask set will not include the desired optional features and circuit resources will be conserved. If options such as options 98 and 104 of FIG. 5 were selected, the circuitry produced using the mask set will include the desired optional features.

Figure 6:
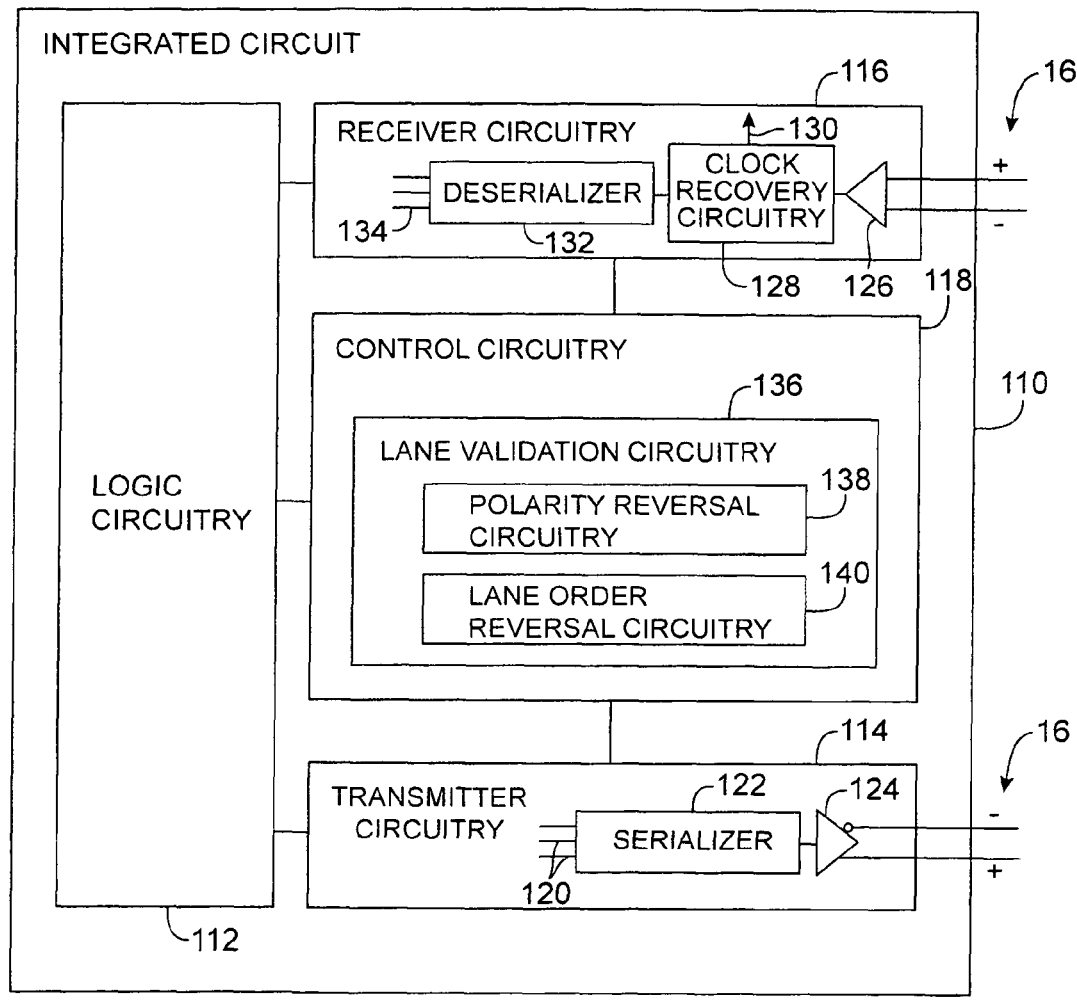
FIG. 6 is a schematic diagram of an illustrative integrated circuit with serial communications circuitry constructed in accordance with the present invention.

A diagram of an illustrative integrated circuit 110 that includes circuitry suitable for performing the functions of the optional lane polarity reversal feature and the optional lane order reversal feature is shown in FIG. 6. Integrated circuit 110 may be a programmable logic device, microprocessor, digital signal processor, application specific integrated circuit, or other suitable integrated circuit. If circuit 110 is a programmable logic device, logic circuitry 112 on integrated circuit 110 will typically include programmable logic such as programmable logic 32 of FIG. 2 and hardwired logic. For other types of integrated circuit, logic circuitry 112 is generally hardwired digital logic circuitry.

Integrated circuit 110 may transmit digital data signals from logic circuitry 112 to other integrated circuits using transmitter circuitry 114. Receiver circuitry 116 may be used to receive digital data signals for logic circuitry 112 from other integrated circuits.

Transmitter circuitry 114 and receiver circuitry 116 are controlled by control circuitry 118.

Transmitter circuitry 114 receives signals from logic circuitry 112. Parallel inputs 120 may be used to provide data from logic circuitry 112 to serializer 122. Serializer 122 may serialize parallel data on inputs 120 so that the data can be transmitted over a serial link having one or more lanes. A differential driver 124 may drive serial data from the output of serializer 122 onto two parallel differential signal lines in lane 16. In the example of FIG. 6, there is only a single lane 16 associated with transmitter circuitry 114. This is merely illustrative. In general there may be one or more parallel lanes in a given serial link 14, as shown in FIG. 1.

Receiver circuitry 116 of FIG. 6 has a differential input driver 126 that receives data from another integrated circuit over a lane 16. Only a single lane 16 is associated with the receiver circuitry 116 in the example of FIG. 6. This is merely illustrative. Multiple parallel lanes in a serial link may be associated with receiver circuitry 116 if desired.

The differential data at the two inputs of differential input driver 126 of receiver circuitry 116 is provided to clock-and-data recovery (CDR) circuitry 128. Clock-and-data recovery circuitry 128 extracts embedded clock information from the incoming signal and provides the extracted clock signals at line 130. Recovered serial data is provided to deserializer 132. Deserializer 132 deserializes the data provided by clock recovery circuitry 128 and provides corresponding parallel data at output lines 134. The parallel data from output lines 134 may be distributed to logic circuitry 112.

The receiver circuitry 116, control circuitry 118, and the transmitter circuitry 114 are used to support serial communications in accordance with the serial communications protocol of the present invention. In a given integrated circuit, the amount and type of circuit resources present in circuitry 116, 118, and 114 depends on which optional serial communications features were included by the logic designer. For example, during the design process, the logic designer may have clicked the lane polarity "test only" option 98 of screen 80 of FIG. 5. In this case, when the integrated circuit is implemented as a chip, the chip will have lane validation circuitry 136 that does not include polarity reversing circuitry. If, however, the logic designer clicked on the lane polarity "test and reverse" option 100 of screen 80 of FIG. 5, the chip will have lane validation circuitry 136 that includes polarity reversal circuitry 138.

Similarly, the logic designer may have clicked the lane order "test only" option 104 of screen 80 of FIG. 5. In this case, when the integrated circuit is implemented as a chip, the chip will have lane validation circuitry 136 that does not include lane order reversal circuitry. If, however, the logic designer clicked on the lane order "test and reverse" option 106 of screen 80 of FIG. 5, the chip will have lane validation circuitry 136 that includes lane order reversal circuitry 140. (Polarity reversal circuitry 138 and lane order reversal circuitry 140 and the other blocks of circuitry shown in FIG. 6 need not be based on mutually exclusive circuit components. If desired, some resources for these blocks of circuitry may be shared. For example, lane polarity reversal functions may be implemented using at least some circuitry in receiver circuitry 116 and in control circuitry 118.)

Both implementations—i.e., the chips that have and that do not have circuitry 138 and 140—are compliant with the serial communications protocol of the present invention. The implementations without the optional serial communications polarity reversal or lane order reversal features will consume fewer logic resources on the integrated circuit and may therefore be less complex and less expensive. The implementations with the optional polarity reversal and lane order reversal features will have added functionality.

Figure 7:
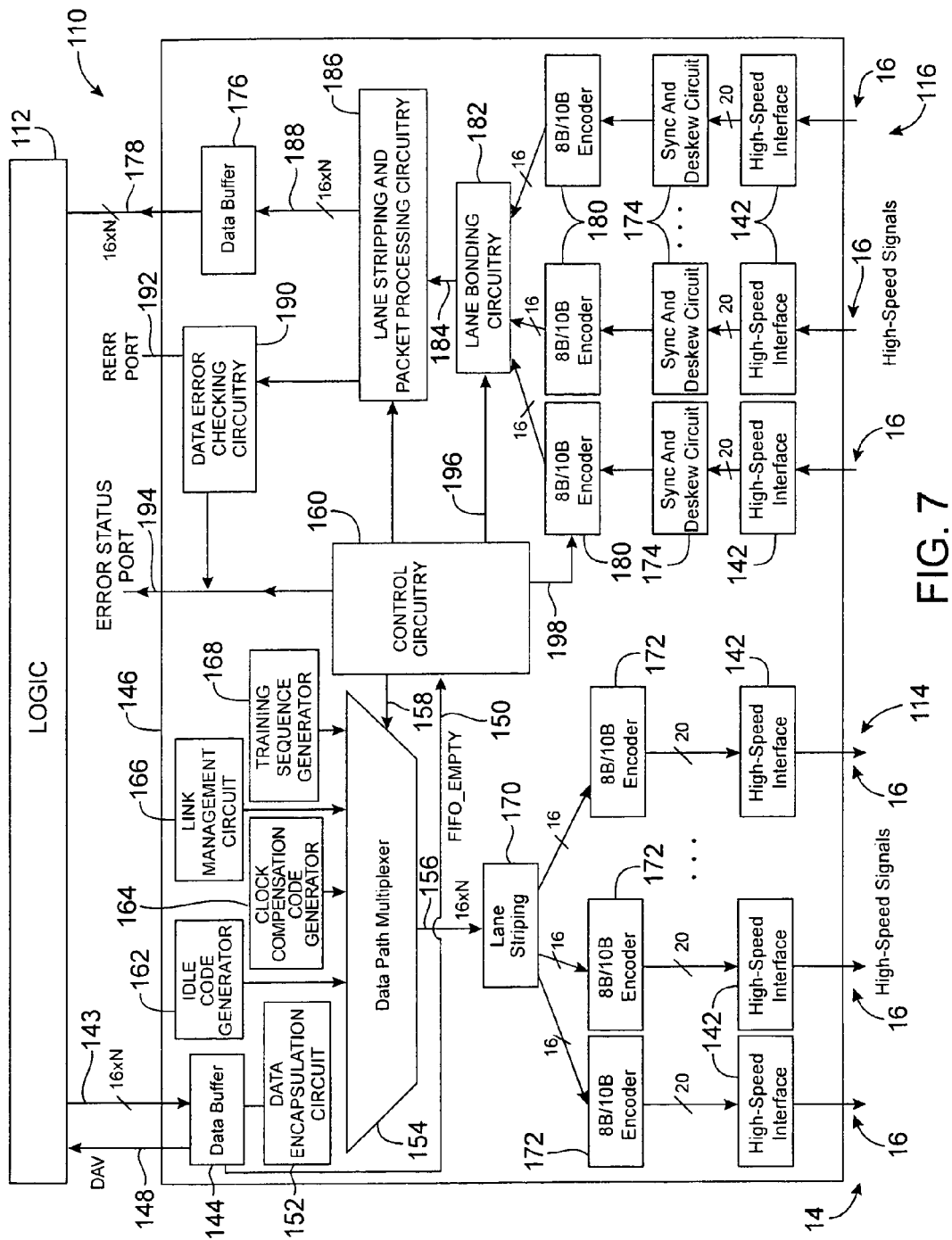
FIG. 7 is a more detailed schematic diagram of an illustrative integrated circuit with serial communications circuitry constructed in accordance with the present invention.

An illustrative integrated circuit 110 which may be used to transmit and receive serial data in accordance with the serial communications protocol of the present invention is shown in FIG. 7. Integrated circuit 110 of FIG. 7 has input/output circuitry 146. Input/output circuitry 146 may, for example, be input/output circuitry such as circuitry 26 of FIG. 2 for integrated circuits 110 that are programmable logic devices.

Input/output circuitry 146 of integrated circuit 110 includes serial communications circuitry. For example, input/output circuitry 146 has transmitter circuitry 114 for transmitting data over one or more lanes 16 of serial link 14. Integrated circuit 110 also has receiver circuitry 116 for receiving serial communications from another integrated circuit over one or more lanes 16. High-speed interface circuitry 142 in the transmitter circuitry 114 includes serializer and driver circuitry such as serializer 122 and driver 124 of FIG. 6. High-speed interface circuitry 142 in the receiver circuitry 116 may include components such as the differential input driver 126, clock-and-data recovery circuitry 128, and deserializer circuitry 132 of FIG. 6.

Each lane 16 has two differential signal lines—a positive (+) line and a negative (−) line (shown in more detail in FIG. 6). To support two-way traffic, link 14 has both outgoing pairs of signal lines connected to transmitter circuitry 114 and incoming pairs of signal lines connected to receiver circuitry 116. The number of lanes 16 in link 14 is given by the integer N in FIG. 7. The value of N may be 1 (in a single-lane link) or may be more than 1. As an example, in a four-lane serial link 14 having four outgoing pairs of differential signal lines and having four incoming pairs of differential signals lines, the value of N is 4.

Data to be transmitted over link 14 from integrated circuit 110 to another integrated circuit is passed from logic 112 to data buffer 144 over paths such as path 143. In the example of FIG. 7, data words have 16 bits and the size of path 143 is N×16, where N is the number of lanes in link 14 (as an example).

Buffer 144 may include circuitry such as first-in-first-out (FIFO) buffer circuitry to help provide an interface between logic 112 and input-output circuitry 146. When no more data can be accepted from logic 112 because the buffer is full, the DAV signal on line 148 may be asserted. Logic 112 may monitor the status of DAV to determine whether or not buffer 144 is ready to accept data. When the FIFO (or other suitable buffer circuitry) in buffer 144 is empty, the FIFO_EMPTY signal on line 150 may be asserted.

If desired, data from data buffer 144 may be encapsulated as packets using data encapsulation circuit 152. During the encapsulation process, a data payload may be encapsulated between start-of-packet (SOP) and end-of-packet (EOP) markers.

A data path multiplexer 154 or other suitable signal routing circuitry may be used to route the data to be transmitted to the final stages of the transmitter. Data path multiplexer 154 may have multiple inputs and a single output 156.

Control circuitry 160 may control the operation of input/output circuitry 146. For example, control circuitry 160 may control data path multiplexer 154 via control path 158. By controlling which control signals are applied to data path multiplexer 154 via control path 158, the control circuitry 160 can select which of the data path multiplexer's inputs is connected to the output 156. When, for example, it is desired to transmit data from data buffer 144 over link 14, the control circuitry 160 can direct the multiplexer 154 to connect the input connected to data encapsulation circuit 152 to output 156.

Data on the other multiplexer inputs may be routed to output 156 as appropriate. Data from idle code generator 162 may be routed through multiplexer 162 when it is desired to transmit idle codes. Clock compensation sequences (codes) from clock compensation code generator 164 may be inserted into the transmitted data to compensate for mismatches between the clock of integrated circuit 110 and the clock of the integrated circuit to which data is being transmitted over link 14. The clock compensation codes may be selectively discarded at the receiver of the receiving integrated circuit to accommodate the clock mismatch.

Link management circuit 166 may be used to handle the generation of link management instructions (packets) for flow control operations, retry-on-error operations, etc. Multiplexer 154 may be used to send these link management instructions into the data stream when appropriate.

Training sequence generator 168 may be used to generate training sequences that are used during link initialization. Training sequence generator 168 may, for example, generate a first training sequence called TS1 and a second training sequence called TS2, which are used at various stages of the link initialization process. The training sequences TS1 and TS2 include handshaking information that is used to bring up link 14 during link initialization. Other types of training sequence information can be generated by generator 168 if desired.

Lane striping circuitry 170 may be used to distribute the 16×N bits of parallel data on output 156 among the N lanes 16. Encoders 172 (e.g., 8B/10B encoders or other suitable encoders) may be used to convert 8-bit bytes of data into corresponding 10-bit coded words. The coded words supplied at the outputs of the encoders have the same information content as the data provided to their inputs. The additional bits in the coded words ensure that there are a sufficient number of high-to-low and low-to-high transitions in the data to allow successful clock extraction at the receiver. At the receiver, circuitry such as clock-and-data recovery circuitry 128 of FIG. 6 can be used to extract the embedded clock signal from the encoded data.

After passing through encoders 172, the outgoing data may be transmitted across link 14 on respective lanes 16 using the serializer and driver circuitry of high-speed interfaces 142. Typically the data being transmitted over link 14 is high-speed data (e.g., data transmitted at data rates of 100s of Mbps or Gbps).

Incoming data from the integrated circuit at the other end of link 14 may be received by the input drivers, clock-and-data recovery circuitry, and deserializers of the high-speed interface circuitry 142 in receiver circuitry 116. When there is more than one lane 16 of incoming data, synchronization and deskewing circuitry 174 may be used to synchronize and deskew the incoming data so that it can be successfully merged into a single stream of data suitable for transmission to logic 112 via data buffer 176 and path 178.

Decoders 180 may be used to decode incoming data (e.g., from 10-bit codes to 8-bit data bytes). Lane bonding circuitry 182 may be used to merge multiple lanes of data into a single data path 184. Lane stripping and packet processing circuitry 186 may be used to remove data encapsulation information from the incoming data (e.g., to remove SOP and EOP characters). Stripped data may be provided at output 188.

Data error checking circuitry 190 may be used to check received data for errors (e.g., errors such as cyclic redundancy check (CRC) errors, 8B/10B errors or other decoding errors, etc.). If data error checking circuitry 190 detects an error, a suitable error signal may be generated. For example, an RERR signal may be asserted on RERR port 192 when an error is detected on the data being received and placed on port 178. If a catastrophic error is detected, a catastrophic error signal may be produced by data error checking circuitry 190 and placed on error status port 194. Control circuitry 160 can also generate catastrophic error signals for port 194 when appropriate. Ports such as port 192 and 194 may be monitored by logic 112.

The way in which the circuitry of FIG. 7 is implemented depends on which optional serial communications link features the logic designer (user) chose when designing the integrated circuit 110 using tools 62. For example, if the user chose to include automatic polarity reversal and automatic lane order reversal features (e.g., by clicking on options 100 and 106 of FIG. 5), the resulting integrated circuit 110 will have polarity reversal and lane order reversal capabilities.

The polarity reversal and lane-order reversal capabilities can be implemented using appropriate receiver circuitry 116.

As an example, polarity reversal functions may be implemented using a polarity-reversing 8B/10B decoder or (e.g., in programmable logic devices without polarity-reversing 8B/10B decoders) as a "soft" polarity reversed 8B/10B decoder constructed from programmable logic. The control circuitry 160 can control such polarity-reversing circuitry using control signals provided over a control path (shown schematically by path 198 in FIG. 7).

As another example, lane order reversal functions may be implemented using lane-order-reversing lane bonding circuitry 182. The lane bonding circuitry 182 may be controlled by control circuitry 160 using control signals provided over a control path such as path 196 of FIG. 7.

Link initialization is a two-sided process. Both a local integrated circuit's transmitter and receiver and the transmitter and receiver of a remote integrated circuit with which the local circuit is communicating are involved. While the transmitting circuitry of the local circuit is transmitting information to the receiving circuitry of the remote circuit, the transmitting circuitry of the remote circuit is generally transmitting information to the receiving circuitry of the local circuit. To fully initialize a bidirectional serial link 14 between the local and remote circuits, both the local and remote circuits must complete the link initialization process.

For clarity, the link initialization process is generally described from the perspective of the local circuit.

Figure 8:
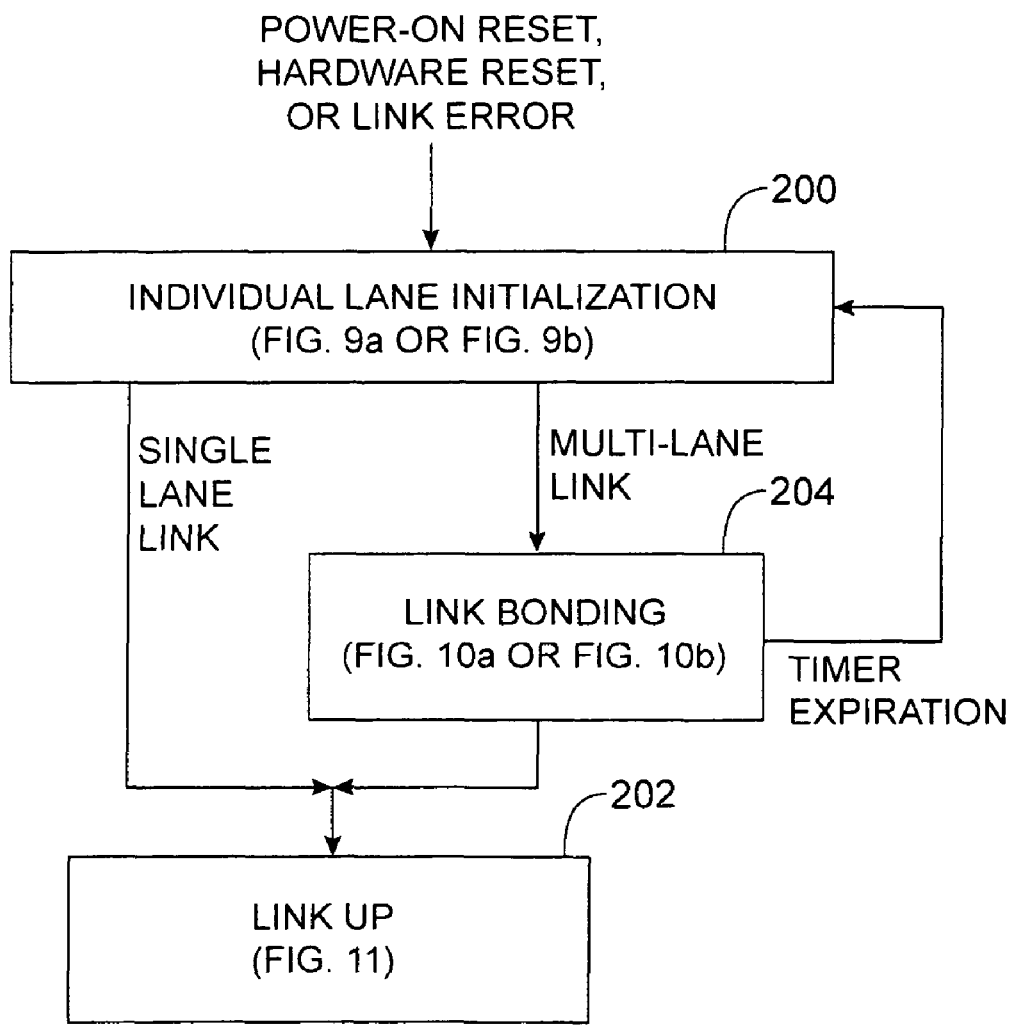
FIG. 8 is a flow chart of illustrative steps involved in initializing a serial communications link in accordance with the present invention.

An overview of a link initialization process that may be used to initialize serial communications links that communicate using the serial communications protocol of the present invention is shown in FIG. 8. The link initialization process may be initiated by a power-on reset, a hardware reset, a link error, or other suitable criteria. A power-on reset condition may occur during a boot-up operation. A hardware reset may follow the press of a button to initiate a hard boot. Link errors may be detected during error checking procedures (e.g., when deskewing and aligning lanes, etc.).

The link initialization procedure of FIG. 8 may be used for single-lane serial links and for serial links having multiple lanes.

If a single lane link is being initialized, lane initialization is performed at step 200. Following successful initialization of the lane, the link set-up process is finalized at step 202 (i.e., by waiting for the remote integrated circuit to finish its link initialization process and declare initialization complete).

If a multilane link is being initialized, each individual lane is first initialized at step 200. After each lane has been successfully initialized at step 200, the initialized lanes are combined to form a multilane link (link bonding step 204) and the link set-up process is finalized at step 202.

The way in which the lane initialization process of step 200 handles lane polarity reversals depends on whether or not the user chose to include the optional automatic polarity reversal feature in the design.

Figure 9A:
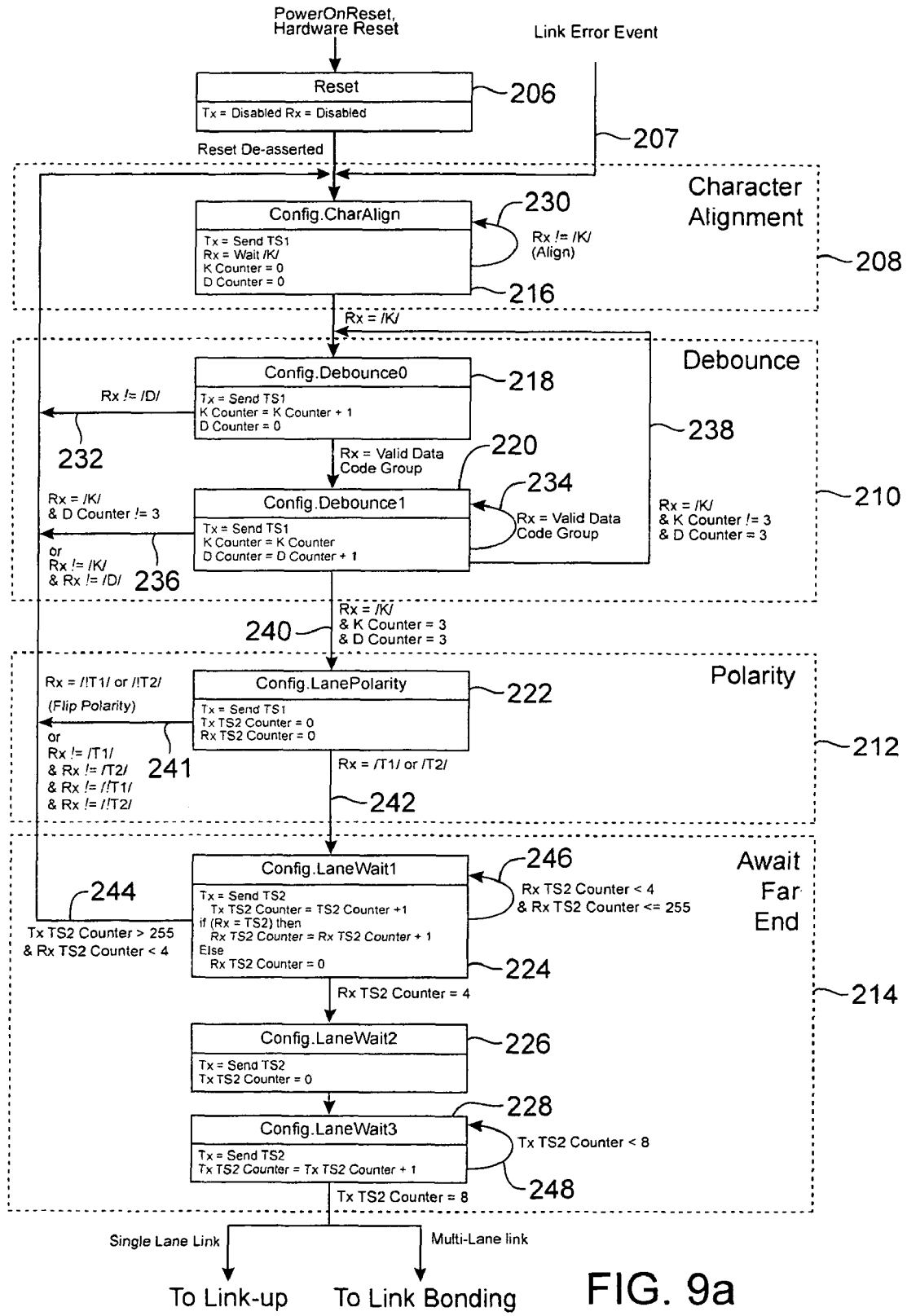
FIG. 9a is a schematic diagram of an illustrative individual lane initialization operation performed by an integrated circuit supporting automatic lane polarity reversal in accordance with the present invention.
Figure 9B:
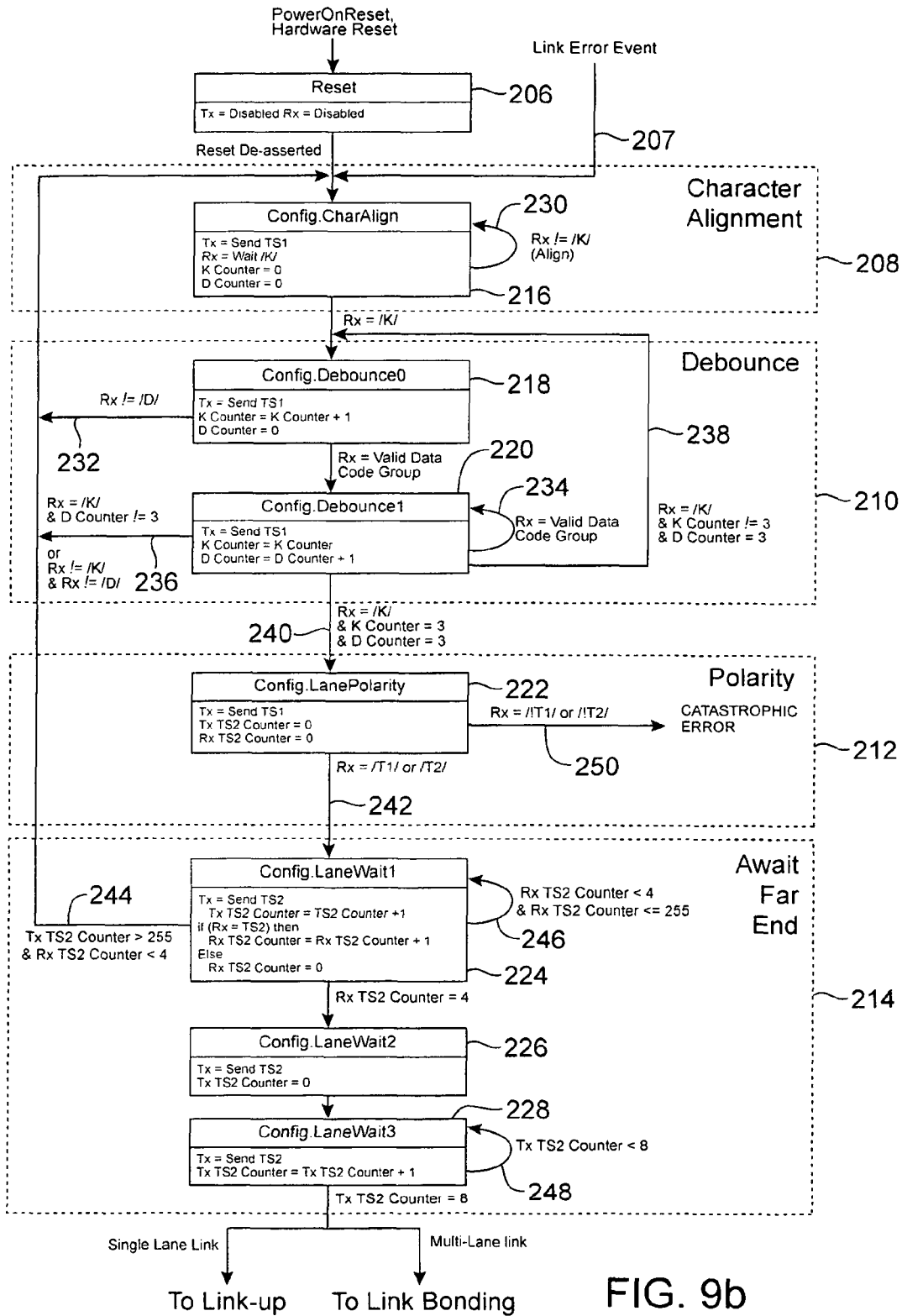
FIG. 9b is a schematic diagram of an illustrative individual lane initialization operation performed by an integrated circuit that does not support automatic lane polarity reversal in accordance with the present invention.

If the automatic polarity reversal feature has been implemented on a given integrated circuit, the control circuitry 160 of the circuit will automatically reverse each lane that has an incorrect polarity, as shown in FIG. 9a. If the automatic polarity reversal feature has not been implemented, the control circuitry 160 will generate an error signal whenever a polarity reversal is detected, as shown in FIG. 9b.

Figure 10A:
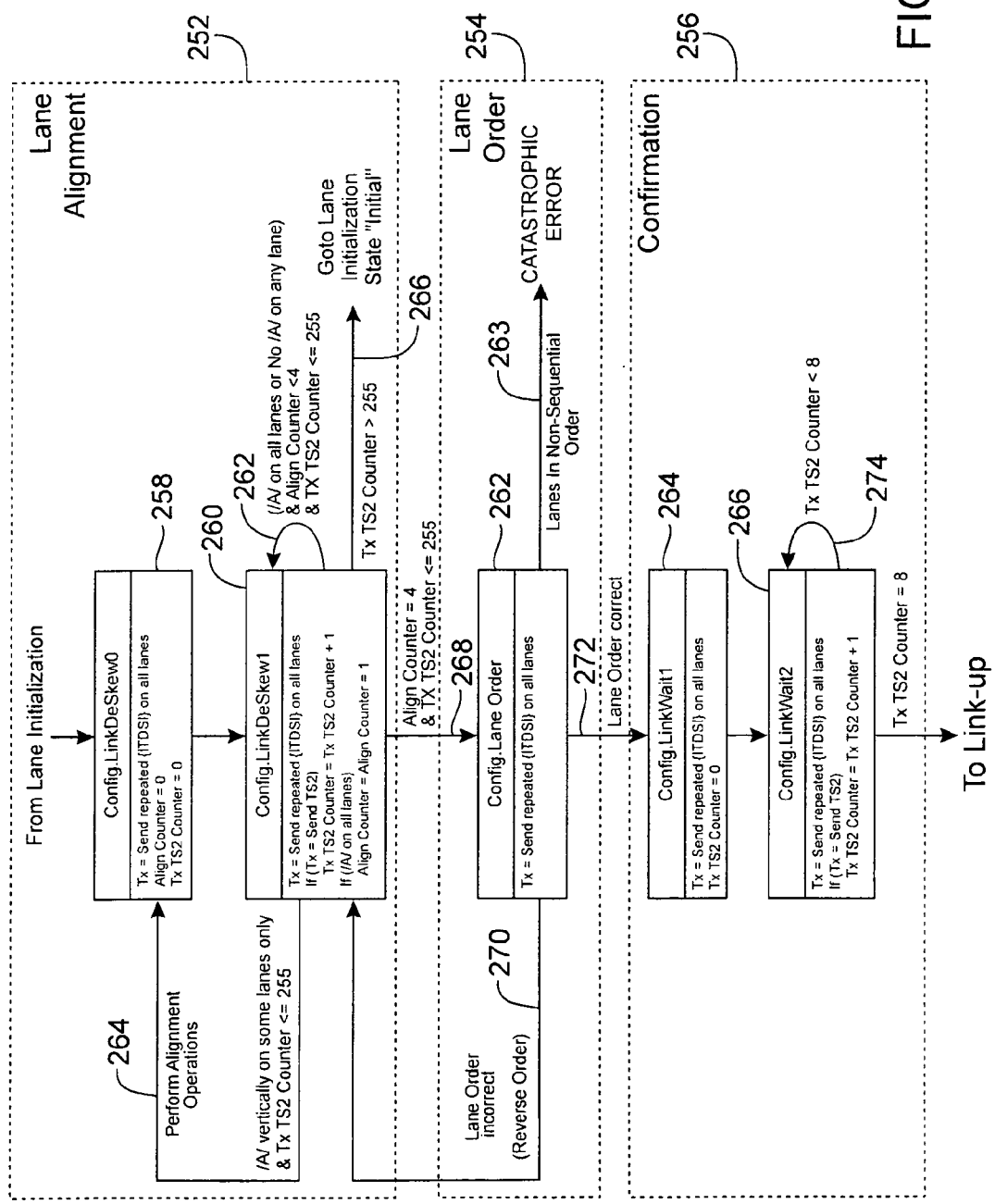
FIG. 10a is a schematic diagram of an illustrative link bonding operation performed by an integrated circuit that supports automatic lane order reversal in accordance with the present invention.
Figure 10B:
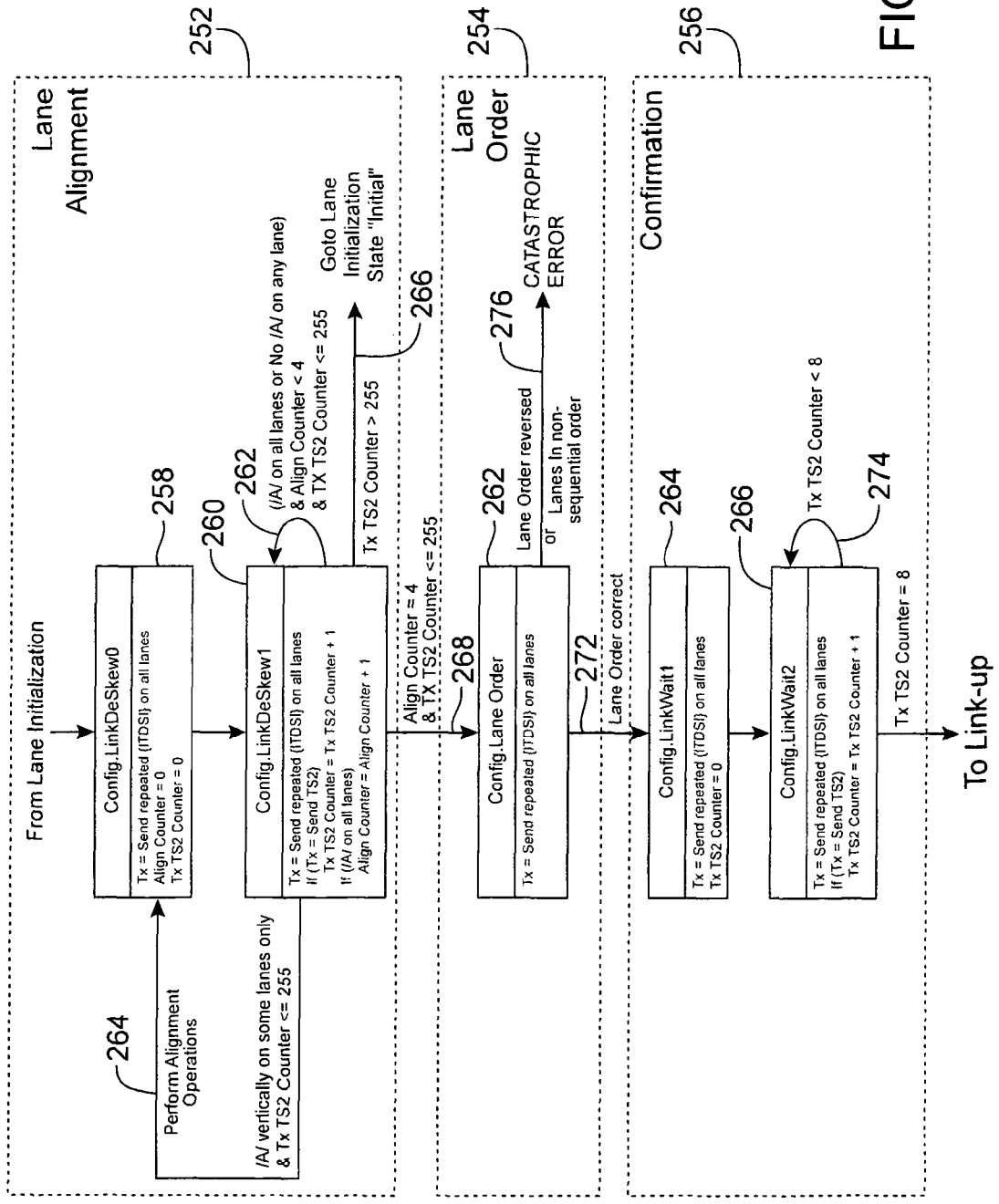
FIG. 10b is a schematic diagram of an illustrative link bonding operation performed by an integrated circuit that does not support automatic lane order reversal in accordance with the present invention.

If the automatic lane-order reversal feature has been implemented, the control circuitry 160 will automatically reverse the order of the lanes whenever a reversed lane order condition is detected, as shown in FIG. 10a. If the automatic lane-order reversal feature has not been implemented, the control circuitry will generate an error signal whenever it is determined that the lanes are not in the correct order, as shown by FIG. 10b.

An illustrative lane initialization process that may be used when the optional automatic polarity reversal feature has been implemented is shown in FIG. 9a. Initially, the circuit 110 is in a reset state 206. In this state, the local transmitter circuitry 114 (Tx) and local receiver circuitry 116 (Rx) are in a "disabled" or "don't care" state. When a user releases an appropriate hardware reset button or when a power-on-reset operation has completed, the variable "reset" is asserted, and the circuit enters character alignment process 208. The character alignment process can also be entered as a result of a link error event, as indicated by line 207.

Character alignment process 208 is used to synchronize and deskew incoming data.

Debounce process 210 ensures that character alignment has been maintained for a sufficient length of time to proceed with the initialization process.

Following debounce operations 210, the circuit checks lane polarity in polarity process 212. If an incorrect lane polarity is detected, the circuit reverses the lane polarity.

Await far end process 214 is used to ensure that the remote integrated circuit has sufficient time to complete its lane initialization process.

Figure 11:
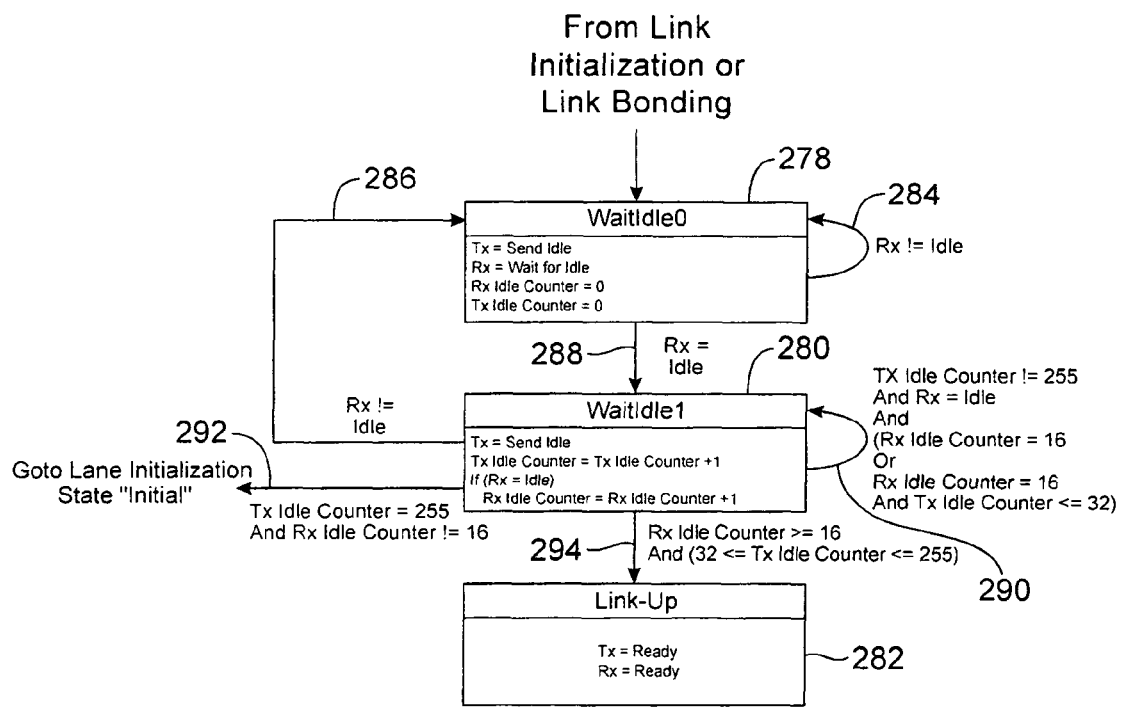
FIG. 11 is a schematic diagram of an illustrative link-up procedure that may be used to complete the link initialization process in accordance with the present invention.

In a single-lane environment, control passes to the link-up process of FIG. 11 following lane initialization. In a multilane environment, control passes to the link-up process of FIG. 11 only after successful completion of the lane bonding process (FIG. 10a or 10b).

Training sequence generator 168 (FIG. 7) generates two training sequences which are used during link initialization. The first training sequence is called "TS1" and the second training sequence is called "TS2."

The training sequence TS1 is used at the beginning of the link initialization process. Training sequence TS1 may include the following sequence of codes: (1) a comma character /K/ in the field TStart, (2) a physical lane number character in the field TLaneNo, (3) a character indicating the total number of lanes in link 14 (in the field TLanes), and (4) a training sequence identifier (T1) in the field TID that identifies the training sequence as training sequence one.

The second training sequence TS2 is used to indicate that individual lane initialization is complete and is used during lane deskewing. The training sequence TS2 includes the following sequence of codes: (1) a comma character /K/ in the field TStart, (2) a physical lane number character in the field TLaneNo, (3) a character indicating the total number of lanes in link 14 (in the field TLanes), and (4) a training sequence identifier (T1) in the field TID that identifies the training sequence as training sequence two. The last three characters in each training sequence are valid non-K characters and are denoted as /D/ characters in the drawings.

During character alignment state 216, the control circuitry 160 (FIG. 7) directs multiplexer 154 to connect its training sequence generator input to output 156. This directs the local transmitting circuitry 114 to send the sequence TS1 to the remote receiver while the local receiver waits for a /K/ character from the remote transmitter (TX2). A K character counter and a D character counter are set to 0. So long as the receiver (Rx) does not receive a /K/, the circuit remains in state 216, as indicated by line 230. (In FIG. 9a and the other FIGS., the character "!" indicates the logical NOT function.)

When a /K/ is received by the local receiver circuitry, the circuit enters state 218. In this state, the transmitter continues to send the TS1 sequence. The K counter is incremented by one to reflect reception of the /K/, while the D counter remains at zero. As indicated by line 232, the circuit will return to the state 230 if the receiver does not receive a valid TS1 character (of any type) after the /K/ is received.

When a valid TS1 character (i.e., a /D/) is received after the /K/, the circuit enters state 220. When entering state 220, the D counter is incremented by one to reflect the reception of the /D/ character. So long as valid /D/ characters are received, the circuit remains in state 220 and the D counter is incremented in sequence, as indicated by line 234. If a /K/ is received when the circuit was expecting a /D/, this indicates a misalignment error, and the circuit returns to state 216 to repeat character alignment process 208, as indicated by path 236.

If a /K/ is received after the D counter has reached three (indicating reception of the complete TS1 sequence) and the K counter is not yet equal to three, the circuit continues to loop through state 218 (debounce is not yet complete), as indicated by line 238.

As indicated by line 240, the debounce process 210 can be considered complete when three complete TS1 sequences have been received successfully from the remote transmitter.

During the polarity process 212, the circuit checks to determine whether the polarity of the differential signal lines in the lane is correct. If the signal lines are unexpectedly reversed (i.e., if the + line is connected where a − line should have been and vice versa), the circuit can automatically correct this problem to ensure that the local and remote circuits can communicate over the lane that is being initialized.

During state 222 of polarity process 212, the local transmitter is sending the training sequence TS1 to the remote receiver. A Tx TS2 counter and an Rx TS2 counter are set to zero (as no character from the TS2 training sequence has yet been received). Lane polarity reversal can be detected by examining the TS1 and TS2 training sequence identifier characters—T1 and T2 received from the remote transmitter. If the circuit detects that the inverse version of either of these characters has been received (i.e., if the received character Rx=!T1 or if the received character Rx=!T2), then the circuit knows that the polarity of the lane is the opposite of what it should be.

Accordingly, the control circuitry 160 can direct the appropriate polarity flipping circuitry in receiving circuitry 116 (e.g., hardwired or soft 8B/10B decoders or other suitable polarity flipping circuitry) to invert the incoming signals on the lane. This operation is indicated by the "Flip Polarity" label on path 241. When the polarity is flipped, the circuit returns to the character alignment process 208, so that the circuit can attempt to initialize the lane with the correct polarity in place. (Note that the state of the polarity does not affect the reception of /K/ characters because these characters are polarity invariant.) The circuit may also return to the character alignment process 208 if the receiver failed to receive a T1 or T2 (or inverted T1 or inverted T2) during state 222 as expected.

If the receiver receives a /T1/ or /T2/ and if this signal is not inverted, then the training sequence is being properly received and the polarity is correct. As a result, the circuit enters state 224, as indicated by line 242.

In state 224, the polarity of the lane is known to be correct, so the transmitter starts to send the second training sequence TS2 to the remote receiver.

As each TS2 sequence is sent, the counter Tx TS2 is incremented by one. At the same time, control circuitry 160 counts the number of TS2 sequences that have been received from the remote transmitter (using the counter Rx TS2 counter). So long as fewer than four TS2 sequences have been received and so long as the total number of transmitted TS2s is less than 255, the circuit remains in state 224, as indicated by line 246. If too many TS2s are sent before four TS2s are received, the process times out and the circuit returns to state 216, as indicated by line 244.

If four TS2 training sequences are received from the far end of the lane, the circuit enters state 226. During state 226, the Tx TS2 counter is set to 0. The circuit then enters state 228. During state 228, the local transmitter sends eight TS2 training sequences to the remote receiver, as indicated by line 248. This provides the remote integrated circuit with time to complete its initialization.

After eight TS2s have been sent, the circuit either proceeds to the link-up process of FIG. 11 (if only a single lane is involved) or to the link bonding process of FIG. 10a or FIG. 10b (when the link 14 includes multiple lanes 16).

As shown in FIG. 9b, the circuit 110 handles the link initialization process differently if the user decided not to implement the optional automatic polarity reversal feature in the circuit. In particular, the polarity process 212 of FIG. 9b (no polarity reversal capability implemented) differs from the polarity process 212 of FIG. 9a (polarity reversal capability implemented). In state 222 of FIG. 9b, the circuit still checks for correct lane polarity (as with state 222 in FIG. 9a). If a /T1/ or /T2/ of the correct polarity is received, the circuit enters state 224, as indicated by line 242.

However, unlike the process of FIG. 9a, the polarity process 212 of FIG. 9b generates an error signal if the incorrect lane polarity is detected. The generation of the error signal occurs when the received character Rx is equal to an inverted (polarity reversed) /T1/ (i.e., !/T1/) or an inverted /T2/, as indicated by path 250. The control circuitry 160 (FIG. 7) can produce an error signal for logic 112 (FIG. 7) using error status port 194 (FIG. 7) when the polarity error is detected during state 222.

After each lane in a multilane link has been individually initialized using the lane initialization process of either FIG. 9a or FIG. 9b, the link bonding process may be performed to link the individual lanes 16 together to form a complete serial link 14.

A link bonding process performed by a circuit that implements the optional automatic lane order reversal feature is shown in FIG. 10a. Lane alignment process 252 is used to deskew the lanes. Lane order process 252 checks the order of the lanes. If the lane order is reversed (i.e., if the lanes are ordered N, N−1, N−2, . . . , rather than being ordered 1, 2, 3, . . . ), the lane order can be corrected. Confirmation process 256 is used to provide sufficient time for the other integrated circuit at the other end of the link to complete its lane bonding process before proceeding.

After lane initialization is complete for all lanes, the circuit enters state 258. In state 258, the transmitter circuitry sends a link deskewing sequence TDS on all lanes simultaneously. The TDS sequence may be generated by training sequence generator 168 (FIG. 7). The TDS sequence may be made up of four TS2s followed by a /K/ and an alignment character /A/. Each TS2 sequence contains a character that defines its lane (i.e., a physical lane number character in the field TLaneNo). For example, the TS2 sequences transmitted on lane 1 may contain a character indicating that the sequences are associated with lane 1, the TS2 sequences transmitted on lane 2 contain a character indicating that these sequences are associated with lane 2, etc. This lane number labelling information can be used by the receiver at the other end of the link to determine if the lanes are ordered properly.

In state 258, an align counter is set to zero. The first time state 258 is entered, a counter Tx TS2 is also set to 0. While the local transmitter is sending the TDS sequences, the remote transmitter at the other end of the link is also sending TDS sequences. During state 260, the receiver waits to receive an alignment character /A/ on all lanes, thereby indicating alignment. If an /A/ is received on all lanes simultaneously, an alignment condition has been detected, and the align counter can be incremented by one (path 262). If more than 255 TS2s are sent during state 260, the process times out, and the circuit returns to the lane initialization process so that each lane can be reinitialized (path 266). If an /A/ is detected on only some of the lanes, the lanes are not aligned. Accordingly, the circuit performs suitable alignment operations to attempt to deskew the signals (indicated by the label "perform alignment operations" on path 264), before returning to state 258 to reset the alignment counter.

After four sets of /A/ characters have been detected across all of the lanes of the link, the link can be considered to be aligned and stable. As indicated by line 268, the circuit can then enter state 262 of lane order process 254.

In state 262, the circuit checks for proper lane order and lane sequence by examining the lane number labeling information in each lane. The lanes may be in the correct order (i.e., 1-1, 2-2, 3-3, and 4-4 in a 4-lane link), may be reversed (i.e., 1-4, 2-3, 3-2, and 4-1), or may be in an unexpected (and non sequential) order (e.g., 1-3, 2-4, 3-1, 4-2).

If the lanes are correctly ordered, the circuit enters state 264, as indicated by path 272.

If the control circuit of the integrated circuit detects that the lane order is incorrect, the circuit can reverse the order (e.g., by issuing appropriate commands to lane bonding circuitry 182 via path 196 that direct circuitry 182 to map the data from the lanes to the lane stripping and packet processing circuitry 186 in the reverse order). This automatic lane order reversal process is indicated by the label "reverse order" on path 270 of FIG. 10a.

If the lane order was sequential, but just reversed, the lane order reversal process of path 270 will place the lanes in their correct order. Accordingly, on the second pass through state 262 (following the confirmation of lane alignment during state 260), the lanes will be properly ordered and the circuit will enter state 264.

If the lanes are not in the correct sequence, a catastrophic error signal may be generated, as shown by line 263.

In state 264, the counter Tx TS2 is reset, while the transmitter continues to transmit TDS sequences for the benefit of the remote circuit. During state 266, the counter Tx TS2 is incremented each time a TS2 sequence has been transmitted. As indicated by path 274, up to 8 TS2 sequences can be transmitted, which gives the remote circuit time to complete its link bonding operations.

After link bonding is complete, the circuit proceeds to the link-up process of FIG. 11.

When the user decides not to include the optional lane order reversal capability in a given integrated circuit, the integrated circuit handles the link bonding process as shown in FIG. 10b.

As shown in FIG. 10b, the lane order process 254 of FIG. 10b is different than the lane order process 254 of FIG. 10a. During state 262, the circuit examines the incoming TS2 sequences and extracts the relevant lane number labels from each lane to determine if the lane order is correct, as with state 262 of FIG. 10a. However, the circuit is not capable of reversing the order of lanes that are not correctly ordered. Rather, as indicated by line 276, the circuit generates error signals (e.g., on error status port 194 of FIG. 7) whenever examination of the lane number information indicates that the lanes are not ordered properly. The error signals may be used by logic 112 to determine an appropriate course of action for the circuit.

Following the link bonding process of FIG. 10a or 10b (for multilane links) or the lane initialization process of FIG. 9a or 9b (for single lane links), the link initialization process can be completed using the link-up process of FIG. 11. In state 278, the local transmitter begins to send idle characters rather than training sequence characters. Idle characters can be generated by idle code generator 162 of FIG. 7. At the same time, the local receiver waits for idle characters from the remote transmitter, as indicated by line 284. The Rx idle counter and Tx idle counter are set to 0.

As soon as the local receiving circuitry 116 receives an idle character, the circuit enters state 280, as indicated by path 288. In state 280, the local transmitter continues to send idle characters to the remote receiver. The transmitter idle counter Tx Idle Counter is incremented by one each time an idle character is sent. The receiver idle counter Rx Idle Counter is incremented by one each time an idle character is received.

As indicated by line 290, this state continues so long as the process has not timed out and continues to receive idles (and so long as fewer than 16 idles have been received or 16 idles have been received while the Tx Idle Counter is less than or equal to 32). If the local transmitter sends 255 idles, but the circuit has not yet received 16 idles, the process times out and the circuit returns to the lane initialization process, as indicated by line 292. If a character other than an idle character is received, the circuit returns to state 278, as indicated by line 286.

If the local receiver receives more than 16 idles and has sent between 32 and 255 idles, the link is deemed to be operating properly and the circuit enters state 282, as indicated by line 294. In state 282, the link initialization process is complete and both ends of the link 14 are ready to transmit and receive data.

Figure 12:
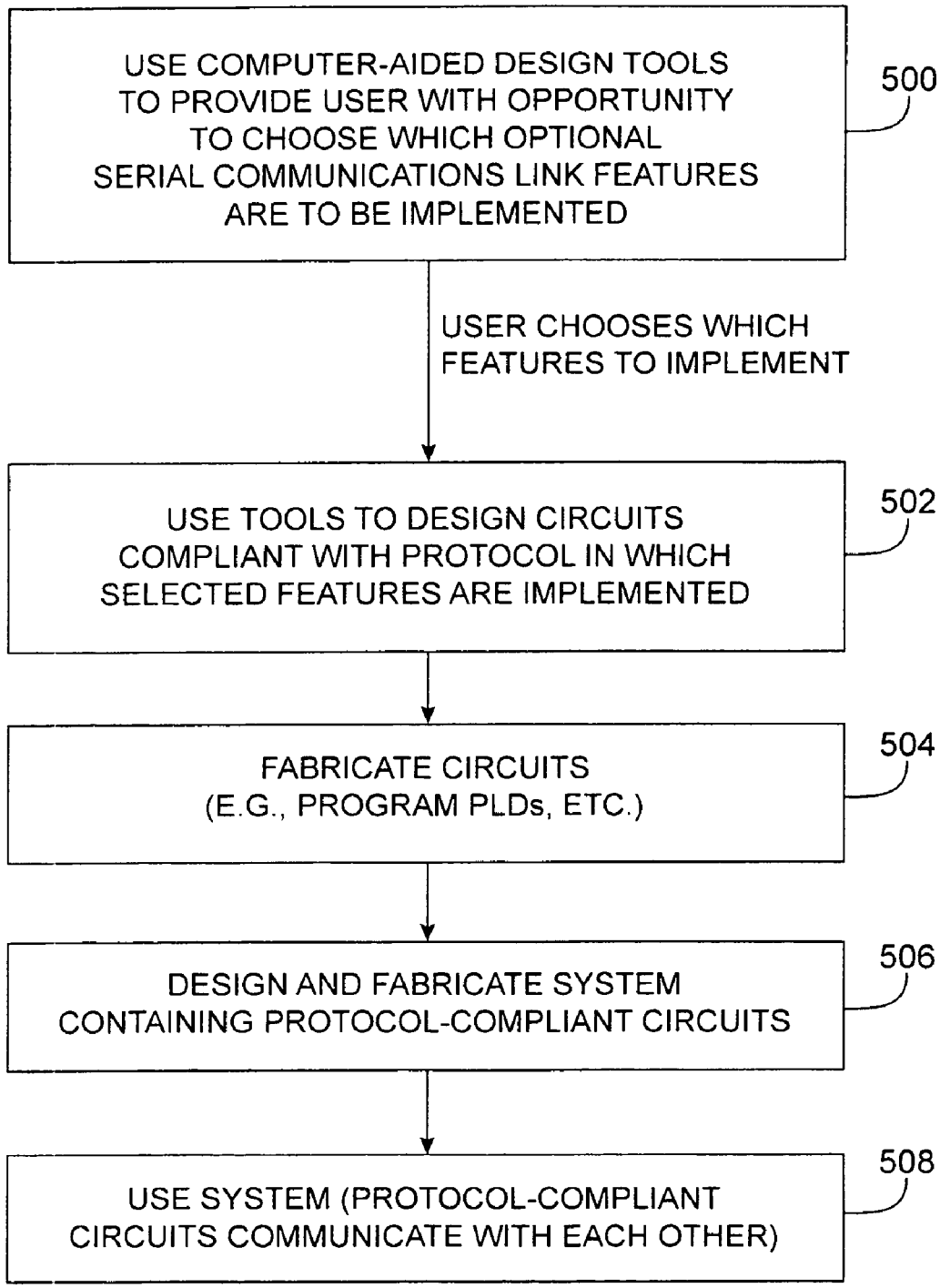
FIG. 12 is a flow chart of illustrative steps involved in designing and using integrated circuits that are compliant with a serial communications protocol in accordance with the present invention.

A flow chart of illustrative steps involved in designing and using integrated circuits that are compliant with a serial communications protocol in accordance with the present invention is shown in FIG. 12. At step 500, computer-aided design tools such as the tools 62 of FIG. 4 are used to provide the user (a single person or multiperson logic design team) with an opportunity to choose which optional serial communications link features are to be implemented. The computer-aided design tools may, for example, display on-screen options with which the user may interact by clicking on items of interest. This is merely one illustrative arrangement by which the user can provide instructions to tools 62. Any suitable arrangement may be used if desired.

When designing a given integrated circuit, the user may direct the tools to implement some or all of the optional serial communications features of the serial communications protocol. At step 502, the tools are used to design one or more integrated circuits that are compliant with the serial communication protocol and in which circuitry is included for performing the functions of the selected optional features while omitting unnecessary circuitry (i.e., circuitry for performing the omitted optional features). If a programmable logic device is being designed, the output of the tools 62 may be provided as configuration data. The output of the tools may also be provide in the form of mask set data for producing integrated circuit lithographic masks for fabricating a circuit implementing the desired design.

After the tools 62 have been used to design the circuit(s) at step 502, the circuit(s) can be fabricated at step 504 (e.g., using semiconductor fabrication techniques, by programming a programmable logic device with configuration data, etc.).

At step 506, a system may be designed and fabricated that contains circuits that are compliant with the protocol. Typically, some of the optional features will have been implemented in the circuits and some of the optional features will have been omitted from the circuits. If desired, the system may contain some protocol-compliant circuits that contain all of the optional features. The system may also contain some protocol-compliant circuits in which all of the optional features that can be omitted have been omitted. During the design and fabrication process of step 506, care should be taken to ensure that the circuits that communicate with each other over links 14 in the system are compatible with each other. For example, if the user directs tools 62 to create a given integrated circuit with four lanes in its link 14, the user should design and fabricate the system to ensure that this circuit communicates only with a corresponding four-lane circuit.

At step 508, the system constructed at step 506 may be used. Because the circuits that are communicating over links 14 are all compliant with the serial communications protocol of the invention and because they have been configured properly (by proper selection of options), the circuits communicate successfully.

The foregoing is merely illustrative of the principles of this invention and various modifications can be made by those skilled in the art without departing from the scope and spirit of the invention.

What is claimed is:

1. A method for creating, with computer-aided design tools, an integrated circuit for communicating with other integrated circuits using a common serial communications protocol that has an optional automatic lane polarity reversal feature, comprising:

enabling user selection to incorporate the optional automatic lane polarity reversal feature into the integrated circuit, wherein the enabling is via the computer-aided design tools; and with the computer-aided design tools, creating the integrated circuit based on the user selection, wherein the integrated circuit implements the optional automatic lane polarity reversal feature in response to user selection of the optional automatic lane polarity reversal feature, and wherein the integrated circuit does not implement the optional automatic lane polarity reversal feature in response to user not selecting the optional automatic lane polarity reversal feature.

2. The method defined in claim 1 wherein enabling the user selection to incorporate the optional automatic lane polarity reversal feature into the integrated circuit comprises displaying an on-screen option for selecting the optional automatic lane polarity reversal feature.

3. The method defined in claim 1 further comprising enabling user selection to incorporate an optional automatic lane order reversal feature into the integrated circuit.

4. The method defined in claim 1 wherein creating the integrated circuit comprises creating configuration data with the computer-aided design tools for a programmable logic device that incorporates the optional automatic lane polarity reversal feature.

5. The method defined in claim 1 creating the integrated circuit comprises creating specifications with the computer-aided design tools for a lithographic mask set for circuitry that incorporates the optional automatic lane polarity reversal feature.

6. A method for creating, with computer-aided design tools, an integrated circuit for communicating with other integrated circuits using a common serial communications protocol that has an optional automatic lane order reversal feature, comprising:

enabling user selection to incorporate the optional automatic lane order reversal feature into the integrated circuit, wherein said enabling is via the computer-aided design tools; and with the computer-aided design tools, creating the integrated circuit based on the user selection, wherein the integrated circuit implements the optional automatic lane order reversal feature in response to user selection of said optional automatic lane order reversal feature, and wherein said created integrated circuit does not implement the optional lane order reversal feature in response to user not selecting said optional automatic lane order reversal feature.

7. The method defined in claim 6 wherein enabling the user selection to incorporate the optional automatic lane order reversal feature comprises displaying an on-screen option to which the user can respond to direct the computer-aided design tool to include or not to include the optional automatic lane order reversal feature.

8. The method defined in claim 6 wherein creating the integrated circuit comprises creating configuration data with the computer-aided design tools for a programmable logic device that incorporates the optional automatic lane order reversal feature.

9. The method defined in claim 6 wherein creating the integrated circuit comprises creating specifications with the computer-aided design tools for a lithographic mask set for circuitry that incorporates the optional automatic lane order reversal feature.

10. A method for designing an integrated circuit with computer-aided design tools that has serial communications circuitry that communicates with another integrated circuit over a serial communications link and that is compliant with a serial communications protocol, wherein the serial communications link has at least one lane, wherein the lane has an associated pair of differential signal conductors that can be connected to the other integrated circuit with a polarity that is either correct or incorrect, and wherein the serial communications protocol has an optional automatic lane polarity reversal feature, comprising:

displaying, with computer-aided design tools, an on-screen option for user selection to either implement the optional automatic lane polarity reversal feature or to not implement the optional lane polarity reversal feature;

in response to user selection to implement the optional automatic lane polarity reversal feature, designing the integrated circuit with the computer-aided design tools such that the serial communications circuitry can automatically reverse the polarity of the at least one lane responsive to incorrect polarity; and in response to user selection to not implement the optional automatic lane polarity reversal feature, designing the integrated circuit with the computer-aided design tools such that the serial communications circuitry cannot automatically reverse the polarity of the lane responsive to incorrect polarity.

11. The method defined in claim 10 wherein the integrated circuit is a programmable logic device and wherein designing the integrated circuit with the computer-aided design tools comprises creating configuration data with the computer-aided design tools for the programmable logic device that incorporates the optional automatic lane polarity reversal feature in response to user selection thereof.

12. The method defined in claim 10, wherein the computer-aided design tools comprise a design entry aid, the method further comprising displaying an on-screen option with the design entry aid that is user selectable to implement the optional automatic lane polarity reversal feature in the integrated circuit.

13. The method defined in claim 10 further comprising designing the integrated circuit with the computer-aided design tools to include serial communications circuitry that generates multiple training sequences that are used to initialize the at least one lane.

14. The method defined in claim 10 further comprising designing the integrated circuit with the computer-aided design tools to include serial communications circuitry that generates an error signal in response to the integrated circuit detecting a lane polarity reversal when the optional automatic lane polarity reversal feature is not implemented in the integrated circuit.

15. The method defined in claim 10 wherein the serial communications link comprises multiple lanes and wherein the lanes have an order that is either correct or incorrect when the integrated circuit is connected to the other integrated circuit with the serial communications link, wherein the serial communications protocol has an optional automatic lane order reversal feature, and wherein the method further comprises displaying an on-screen option for user selection to either implement the optional automatic lane order reversal feature or to not implement the optional lane order reversal feature.

16. The method defined in claim 15 further comprising:

in response to user selection to implement the optional automatic lane order reversal feature, designing the integrated circuit with the computer-aided design tools such that the serial communications circuitry can automatically reverse the order of the lanes responsive to incorrect lane order; and in response to user selection to not implement the optional automatic lane order reversal feature, designing the integrated circuit with the computer-aided design tools such that the serial communications circuitry cannot automatically reverse the order of the lane responsive to incorrect lane order.

17. A method for designing an integrated circuit with computer-aided design tools that has serial communications circuitry that communicates with another integrated circuit over a serial communications link and that is compliant with a serial communications protocol, wherein the serial communications link has multiple lanes, wherein the lanes have either a correct order or an incorrect order when connected to the other integrated circuit, and wherein the serial communications protocol has an optional automatic lane order reversal feature, comprising:

displaying an on-screen option with the computer-aided design tools for user selection to either implement the optional automatic lane order reversal feature or to not implement the optional lane order reversal feature;

in response to user selection to implement the optional automatic lane order reversal feature, designing the integrated circuit with the computer-aided design tools such that the serial communications circuitry can automatically reverse the order of the lanes responsive to incorrect lane order; and in response to user selection to not implement the optional automatic lane order reversal feature, designing the integrated circuit with the computer-aided design tools such that the serial communications circuitry cannot automatically reverse the order of the lanes responsive to incorrect lane order.

18. The method defined in claim 17 wherein the integrated circuit is a programmable logic device and wherein designing the integrated circuits with the computer-aided design tools comprises creating configuration data with the computer-aided design tools for the programmable logic device that incorporates the optional automatic lane order reversal feature.

19. The method defined in claim 17 wherein the computer-aided design tools comprise a design entry aid, the method further comprising displaying the on-screen option with the design entry aid for user selection to implement the optional automatic lane order reversal feature in the integrated circuit.

20. The method defined in claim 17 further comprising designing the integrated circuit with the computer-aided design tools to include serial communications circuitry that generates an error signal in response to the integrated circuit detecting incorrect lane order when the optional automatic lane order reversal feature is not implemented in the integrated circuit.

21. A plurality of integrated circuits that use a common serial communications protocol to communicate over serial communications links, wherein the serial communications links each have a plurality of lanes having associated pairs of differential signal conductors, wherein each lane has a polarity that is correct or incorrect when the differential signal lines for that lane are connected between respective circuits, wherein the lanes in each link have a lane order that is either correct or incorrect when the lanes in the link are connected between respective circuits, and wherein the serial communications protocol has an optional automatic lane polarity reversal feature that allows a given lane's polarity to be reversed when its polarity is incorrect and an optional automatic lane order reversal feature that allows the order of a given link's lanes to be reversed when incorrect, comprising:

first integrated circuits that are compliant with the serial communications protocol and that have serial communications circuitry that implements the optional automatic lane polarity reversal feature and the optional automatic lane order reversal feature; and second integrated circuits that are compliant with the serial communications protocol and that have serial communications circuitry that does not implement the optional automatic lane polarity reversal feature and the optional automatic lane order reversal feature.

* * * * *